(12) United States Patent
Watanabe et al.

(10) Patent No.: US 12,334,480 B2
(45) Date of Patent: Jun. 17, 2025

(54) DISPLAY DEVICE, DISPLAY MODULE, AND ELECTRONIC DEVICE

(71) Applicant: SEMICONDUCTOR ENERGY LABORATORY CO., LTD., Atsugi (JP)

(72) Inventors: Kazunori Watanabe, Tokyo (JP); Koji Kusunoki, Kanagawa (JP); Taiki Nonaka, Kanagawa (JP); Hiroki Adachi, Tochigi (JP); Koichi Takeshima, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 18/679,945

(22) Filed: May 31, 2024

(65) Prior Publication Data

US 2024/0413130 A1      Dec. 12, 2024

Related U.S. Application Data

(63) Continuation of application No. 17/270,722, filed as application No. PCT/IB2019/057136 on Aug. 26, 2019, now Pat. No. 12,033,987.

(30) Foreign Application Priority Data

Sep. 7, 2018   (JP) .................................. 2018-167554

(51) Int. Cl.
  *H01L 25/075*   (2006.01)
  *H01L 27/12*    (2006.01)
  (Continued)

(52) U.S. Cl.
  CPC ...... *H01L 25/0753* (2013.01); *H01L 27/1207* (2013.01); *H01L 27/1225* (2013.01);
  (Continued)

(58) Field of Classification Search
  CPC ............. H01L 25/0753; H01L 27/1207; H01L 27/1225; H01L 29/78648
  See application file for complete search history.

(56) References Cited

U.S. PATENT DOCUMENTS

| 6,501,227 B1 | 12/2002 | Koyama |
| 7,358,935 B2 | 4/2008 | Yamashita et al. |

(Continued)

FOREIGN PATENT DOCUMENTS

| CN | 101000938 A | 7/2007 |
| CN | 101060152 A | 10/2007 |

(Continued)

OTHER PUBLICATIONS

International Search Report (Application No. PCT/IB2019/057136) Dated Nov. 19, 2019.

(Continued)

*Primary Examiner* — Thao P Le
(74) *Attorney, Agent, or Firm* — NIXON PEABODY LLP; Jeffrey L. Costellia

(57) ABSTRACT

A display device with high display quality is provided. A display device with low power consumption is provided. In the display device, a first transistor, a second transistor, a first conductive layer, and a light-emitting diode package are included in a pixel. The light-emitting diode package includes a first light-emitting diode, a second light-emitting diode, a second conductive layer, a third conductive layer, and a fourth conductive layer. The first light-emitting diode includes a first electrode and a second electrode. The second light-emitting diode includes a third electrode and a fourth electrode. One of a source and a drain of the first transistor is electrically connected to the first electrode through the second conductive layer. One of a source and a drain of the second transistor is electrically connected to the third electrode through the third conductive layer. The first conductive (Continued)

layer is electrically connected to each of the second electrode and the fourth electrode through the fourth conductive layer. A constant potential is supplied to the first conductive layer.

16 Claims, 13 Drawing Sheets

(51) Int. Cl.
    *H01L 29/786*      (2006.01)
    *H01L 33/62*      (2010.01)

(52) U.S. Cl.
    CPC .... *H01L 29/78648* (2013.01); *H01L 29/7869* (2013.01); *H01L 33/62* (2013.01)

(56) References Cited

U.S. PATENT DOCUMENTS

| | | | |
|---|---|---|---|
| 8,405,318 B2 | 3/2013 | Hatakenaka et al. | |
| 9,105,813 B1 | 8/2015 | Chang | |
| 9,153,171 B2 | 10/2015 | Sakariya et al. | |
| 9,219,197 B1 | 12/2015 | Chen et al. | |
| 9,231,153 B2 | 1/2016 | Chen et al. | |
| 9,280,931 B2 | 3/2016 | Kimura | |
| 9,478,597 B2 | 10/2016 | Yamazaki et al. | |
| 9,590,137 B2 | 3/2017 | Chen et al. | |
| 9,954,112 B2 | 4/2018 | Asami et al. | |
| 10,056,413 B2 | 8/2018 | Kimura | |
| 10,158,043 B2 | 12/2018 | Chen et al. | |
| 10,361,254 B2 | 7/2019 | Park et al. | |
| 10,361,393 B2 | 7/2019 | Kim et al. | |
| 10,388,638 B2 | 8/2019 | Lin | |
| 10,453,759 B2 | 10/2019 | Iguchi | |
| 10,466,560 B2 | 11/2019 | Yamazaki et al. | |
| 10,559,249 B2 | 2/2020 | Yoneda | |
| 10,615,189 B2 | 4/2020 | Kimura | |
| 10,700,247 B2 | 6/2020 | Kiridoshi et al. | |
| 10,720,558 B2 | 7/2020 | Moon et al. | |
| 10,756,118 B2 | 8/2020 | Yamazaki et al. | |
| 10,763,180 B2 | 9/2020 | Iguchi | |
| 10,804,338 B2 | 10/2020 | Park et al. | |
| 10,816,841 B2 | 10/2020 | Eguchi et al. | |
| 11,139,359 B2 | 10/2021 | Yamazaki et al. | |
| 11,245,039 B2 | 2/2022 | Asami et al. | |
| 11,442,302 B2 | 9/2022 | Eguchi et al. | |
| 11,456,320 B2 | 9/2022 | Yamazaki et al. | |
| 11,476,440 B2 | 10/2022 | Kim et al. | |
| 11,527,583 B2 | 12/2022 | Park et al. | |
| 11,587,957 B2 | 2/2023 | Kimura | |
| 11,837,607 B2 | 12/2023 | Yamazaki et al. | |
| 12,074,224 B2 | 8/2024 | Asami et al. | |
| 2005/0093434 A1 | 5/2005 | Suh et al. | |
| 2005/0156828 A1 | 7/2005 | Yamashita et al. | |
| 2006/0128054 A1* | 6/2006 | Kim | H10K 71/166 438/30 |
| 2010/0102752 A1 | 4/2010 | Chen et al. | |
| 2010/0207142 A1 | 8/2010 | Chen et al. | |
| 2011/0220898 A1 | 9/2011 | Yoon et al. | |
| 2013/0214315 A1 | 8/2013 | Ling et al. | |
| 2014/0168037 A1 | 6/2014 | Sakariya et al. | |
| 2014/0292745 A1 | 10/2014 | Kikuchi et al. | |
| 2014/0367705 A1 | 12/2014 | Bibl et al. | |
| 2015/0014738 A1 | 1/2015 | Ling et al. | |
| 2015/0021634 A1 | 1/2015 | Ishihara et al. | |
| 2015/0060920 A1 | 3/2015 | Horikawa | |
| 2015/0187898 A1 | 7/2015 | Miyairi | |
| 2015/0236228 A1 | 8/2015 | Kim et al. | |
| 2015/0339979 A1 | 11/2015 | Kikuchi et al. | |
| 2015/0349200 A1 | 12/2015 | Chen et al. | |
| 2015/0349285 A1 | 12/2015 | Seo et al. | |
| 2016/0013170 A1 | 1/2016 | Sakariya et al. | |
| 2016/0027965 A1 | 1/2016 | Tsai et al. | |
| 2016/0268513 A1 | 9/2016 | Ishisone et al. | |
| 2016/0351767 A1 | 12/2016 | Choi et al. | |
| 2017/0062749 A1 | 3/2017 | Seo et al. | |
| 2017/0090246 A1 | 3/2017 | Seo et al. | |
| 2017/0133550 A1 | 5/2017 | Schuele et al. | |
| 2017/0170200 A1 | 6/2017 | Ikeda et al. | |
| 2017/0186365 A1 | 6/2017 | Yoneda | |
| 2017/0205666 A1 | 7/2017 | Suh | |
| 2018/0012949 A1 | 1/2018 | Takeya et al. | |
| 2018/0047876 A1 | 2/2018 | Chu et al. | |
| 2018/0122836 A1 | 5/2018 | Kang et al. | |
| 2018/0175268 A1 | 6/2018 | Moon et al. | |
| 2018/0248043 A1 | 8/2018 | Asami et al. | |
| 2018/0254226 A1 | 9/2018 | Iguchi | |
| 2019/0095019 A1 | 3/2019 | Shin et al. | |
| 2019/0107271 A1 | 4/2019 | Lin | |
| 2019/0165223 A1 | 5/2019 | Kiridoshi et al. | |
| 2019/0244937 A1 | 8/2019 | Honjo et al. | |
| 2019/0326370 A1* | 10/2019 | Lu | H10K 59/1315 |
| 2020/0006688 A1 | 1/2020 | Seo et al. | |
| 2020/0027388 A1 | 1/2020 | Iwaki et al. | |
| 2020/0343148 A1 | 10/2020 | Iguchi | |
| 2020/0403028 A1 | 12/2020 | Kusunoki et al. | |
| 2021/0066538 A1 | 3/2021 | Liu et al. | |
| 2021/0118855 A1 | 4/2021 | Kusunoki et al. | |
| 2021/0174734 A1 | 6/2021 | Takahashi et al. | |
| 2021/0193893 A1 | 6/2021 | Choi et al. | |
| 2021/0217805 A1 | 7/2021 | Kusunoki et al. | |
| 2021/0327865 A1 | 10/2021 | Yamazaki et al. | |
| 2021/0366980 A1 | 11/2021 | Lee et al. | |
| 2022/0020841 A1 | 1/2022 | Yamazaki et al. | |
| 2022/0190192 A1* | 6/2022 | Park | H01L 33/005 |
| 2022/0198996 A1 | 6/2022 | Chou et al. | |
| 2022/0390787 A1 | 12/2022 | Eguchi et al. | |
| 2023/0060805 A1 | 3/2023 | Kim et al. | |
| 2023/0091647 A1 | 3/2023 | Park et al. | |
| 2023/0230957 A1 | 7/2023 | Kim et al. | |
| 2023/0238372 A1* | 7/2023 | Lee | H01L 33/38 |
| 2023/0238493 A1 | 7/2023 | Lee et al. | |
| 2023/0238496 A1 | 7/2023 | Bok et al. | |
| 2023/0246147 A1 | 8/2023 | Bok et al. | |
| 2023/0317741 A1 | 10/2023 | Kimura | |
| 2024/0072065 A1 | 2/2024 | Yamazaki et al. | |

FOREIGN PATENT DOCUMENTS

| | | |
|---|---|---|
| CN | 101919057 A | 12/2010 |
| CN | 203218328 U | 9/2013 |
| CN | 103545342 A | 1/2014 |
| CN | 104103677 A | 10/2014 |
| CN | 104979326 A | 10/2015 |
| CN | 106980205 A | 7/2017 |
| CN | 107924653 A | 4/2018 |
| CN | 108206234 A | 6/2018 |
| CN | 108227274 A | 6/2018 |
| CN | 109328378 A | 2/2019 |
| CN | 113160758 A | 7/2021 |
| DE | 102017129926 | 6/2018 |
| EP | 3264484 A | 1/2018 |
| EP | 3285137 A | 2/2018 |
| EP | 3321961 A | 5/2018 |
| EP | 3696646 A | 8/2020 |
| GB | 2559046 | 7/2018 |
| JP | 2003-209295 A | 7/2003 |
| JP | 2008-211131 A | 9/2008 |
| JP | 2013-137509 A | 7/2013 |
| JP | 2015-023220 A | 2/2015 |
| JP | 2016-174143 A | 9/2016 |
| JP | 2018-077376 A | 5/2018 |
| JP | 2018-101785 A | 6/2018 |
| JP | 2018-530792 | 10/2018 |
| KR | 2018-0062373 A | 6/2018 |
| KR | 2018-0071743 A | 6/2018 |
| TW | 201545038 | 12/2015 |
| TW | 201810758 | 3/2018 |
| TW | 201816570 | 5/2018 |
| WO | WO-2008/138182 | 11/2008 |
| WO | WO-2010/032629 | 3/2010 |
| WO | WO-2011/004755 | 1/2011 |
| WO | WO-2013/058199 | 4/2013 |
| WO | WO-2015/083042 | 6/2015 |

(56) References Cited

FOREIGN PATENT DOCUMENTS

| WO | WO-2016/120741 | 8/2016 |
| WO | WO-2017/005225 | 1/2017 |
| WO | WO-2017/043216 | 3/2017 |
| WO | WO-2018/003027 | 1/2018 |
| WO | WO-2018/033822 | 2/2018 |

OTHER PUBLICATIONS

Written Opinion (Application No. PCT/IB2019/057136) Dated Nov. 19, 2019.
Chinese Office Action (Application No. 201980058182.9) Dated Aug. 29, 2022.
Chinese Office Action (Application No. 201980058182.9) Dated Mar. 8, 2023.
Scheffer.D et al., "Random Addressable 2048×2048 Active Pixel Image Sensor", IEEE Transactions on Electron Devices, Oct. 1, 1997, vol. 44, No. 10, pp. 1716-1720.
Hwang.S et al., "A Hybrid Micro-Pixel Based Deep Ultraviolet Light-Emitting Diode Lamp", Applied Physics Express, Dec. 16, 2010, vol. 4, pp. 012102-1-012102-3, The Japan Society of Applied Physics.
Taiwanese Office Action (Application No. 108130993) Dated May 24, 2023.

\* cited by examiner

DISPLAY DEVICE, DISPLAY MODULE, AND ELECTRONIC DEVICE

TECHNICAL FIELD

One embodiment of the present invention relates to a display device, a display module, and an electronic device.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a driving method thereof, or a manufacturing method thereof.

BACKGROUND ART

In recent years, a display device using a micro light-emitting diode (a micro LED (Light Emitting Diode)) as a display element has been proposed (e.g., Patent Document 1). The display device using a micro LED as a display element has advantages of high luminance, high contrast, a long lifetime, and the like, and has been actively developed as a next-generation display device.

REFERENCE

Patent Document

[Patent Document 1] Specification of United States Patent Application Publication No. 2014/0367705

SUMMARY OF THE INVENTION

Problems to be Solved by the Invention

An object of one embodiment of the present invention is to provide a display device with high resolution. An object of one embodiment of the present invention is to provide a display device with high display quality. An object of one embodiment of the present invention is to provide a display device with low power consumption. An object of one embodiment of the present invention is to provide a highly reliable display device.

Note that the description of these objects does not preclude the existence of other objects. One embodiment of the present invention does not need to achieve all the objects. Other objects can be derived from the descriptions of the specification, the drawings, and the claims.

Means for Solving the Problems

In the display device of one embodiment of the present invention, a first transistor, a second transistor, a first conductive layer, and a light-emitting diode package are included in a pixel. The light-emitting diode package includes a first light-emitting diode, a second light-emitting diode, a second conductive layer, a third conductive layer, and a fourth conductive layer. The first light-emitting diode includes a first electrode and a second electrode. The second light-emitting diode includes a third electrode and a fourth electrode. One of a source and a drain of the first transistor is electrically connected to the first electrode through the second conductive layer. One of a source and a drain of the second transistor is electrically connected to the third electrode through the third conductive layer. The first conductive layer is electrically connected to the second electrode through the fourth conductive layer. The first conductive layer is electrically connected to the fourth electrode through the fourth conductive layer. A constant potential is supplied to the first conductive layer.

Alternatively, in the display device of one embodiment of the present invention, a first transistor, a second transistor, a third transistor, a first conductive layer, and a light-emitting diode package are included in a pixel. The light-emitting diode package includes a first light-emitting diode, a second light-emitting diode, a third light-emitting diode, a second conductive layer, a third conductive layer, a fourth conductive layer, and a fifth conductive layer. The first light-emitting diode includes a first electrode and a second electrode. The second light-emitting diode includes a third electrode and a fourth electrode. The third light-emitting diode includes a fifth electrode and a sixth electrode. One of a source and a drain of the first transistor is electrically connected to the first electrode through the second conductive layer. One of a source and a drain of the second transistor is electrically connected to the third electrode through the third conductive layer. One of a source and a drain of the third transistor is electrically connected to the fifth electrode through the fifth conductive layer. The first conductive layer is electrically connected to the second electrode through the fourth conductive layer. The first conductive layer is electrically connected to the fourth electrode through the fourth conductive layer. The first conductive layer is electrically connected to the sixth electrode through the fourth conductive layer. A constant potential is supplied to the first conductive layer.

It is preferable that the first light-emitting diode, the second light-emitting diode, and the third light-emitting diode be each a mini light-emitting diode. Alternatively, it is preferable that the first light-emitting diode, the second light-emitting diode, and the third light-emitting diode be each a micro light-emitting diode.

It is preferable that the first light-emitting diode, the second light-emitting diode, and the third light-emitting diode emit light of different colors from each other. For example, it is preferable that the first light-emitting diode emit red light, the second light-emitting diode emit green light, and the third light-emitting diode emit blue light.

It is preferable that the first transistor, the second transistor, and the third transistor each include a metal oxide in a channel formation region.

It is preferable that the fourth conductive layer and the second electrode be electrically connected to each other through a first wire.

It is preferable that the fourth conductive layer and the fourth electrode be electrically connected to each other through a second wire.

It is preferable that the second conductive layer and the first electrode be in contact with each other.

It is preferable that the third conductive layer and the third electrode be electrically connected to each other through a third wire.

One embodiment of the present invention is a module including a display device with the above-described structure, such as a module to which a connector such as a flexible printed circuit (hereinafter referred to as FPC) or a TCP (Tape Carrier Package) is attached or a module on which an integrated circuit (IC) is mounted by a COG (Chip On Glass) method, a COF (Chip On Film) method, or the like.

One embodiment of the present invention is an electronic device including the above module and at least one of an antenna, a battery, a housing, a camera, a speaker, a microphone, and an operation button.

Effect of the Invention

According to one embodiment of the present invention, a display device with high resolution can be provided. According to one embodiment of the present invention, a display device with high display quality can be provided. According to one embodiment of the present invention, a display device with low power consumption can be provided. According to one embodiment of the present invention, a highly reliable display device can be provided.

Note that the descriptions of the effects do not disturb the existence of other effects. One embodiment of the present invention does not need to have all the effects. Other effects can be derived from the descriptions of the specification, the drawings, and the claims.

MODE FOR CARRYING OUT THE INVENTION

Figure 1A:
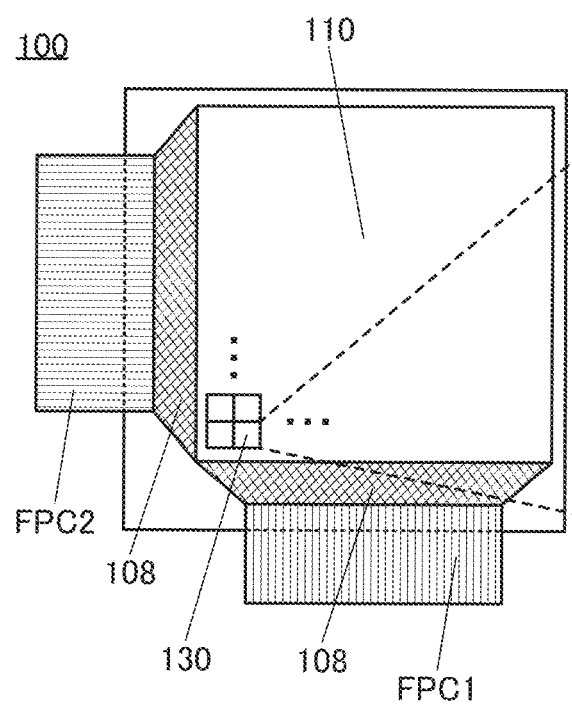
FIGS. 1A to 1D are top views illustrating an example of a display device.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the descriptions in the following embodiments.

Note that in structures of the present invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

Embodiment 1

In this embodiment, a display device of one embodiment of the present invention is described with reference to FIG. 1 to FIG. 7.

Overview of Display Device

In the display device of this embodiment, a pixel includes a first transistor, a second transistor, a first conductive layer, and a light-emitting diode package (also referred to as an LED package).

The LED package has a structure in which one or a plurality of light-emitting diodes (or light-emitting diode chips (also referred to as LED chips)) are sealed in a lead frame, a board, a case, or the like.

The LED package includes a first light-emitting diode, a second light-emitting diode, a second conductive layer, a third conductive layer, and a fourth conductive layer.

The first light-emitting diode includes a first electrode and a second electrode. The first electrode functions as a pixel electrode of the first light-emitting diode. One of a source and a drain of the first transistor is electrically connected to the first electrode through the second conductive layer.

The second light-emitting diode includes a third electrode and a fourth electrode. The third electrode functions as a pixel electrode of the second light-emitting diode. One of a source and a drain of the second transistor is electrically connected to the third electrode through the third conductive layer.

The second electrode functions as a common electrode of the first light-emitting diode, and the fourth electrode functions as a common electrode of the second light-emitting diode. The first conductive layer is electrically connected to the second electrode through the fourth conductive layer. The first conductive layer is electrically connected to the fourth electrode through the fourth conductive layer. A constant potential is supplied to the first conductive layer.

The LED package is mounted on a circuit board in which a plurality of transistors are formed, whereby the display device of this embodiment can be manufactured. Therefore, the manufacturing time of the display device can be shortened and the degree of difficulty of the manufacture can be reduced as compared to those in the case of a method in which light-emitting diodes (or LED chips) are mounted on a circuit board one by one. Thus, the yield in the manufacture of the display device can be increased. Furthermore, the definition and size of the display device can be increased.

The display device of this embodiment has a function of displaying an image with the use of the light-emitting diodes. In the case where a light-emitting diode, which is a self-luminous element, is used as a display element, a backlight is unnecessary and a polarizing plate is not necessarily provided in the display device. Therefore, the display device can have reduced power consumption and can be thin and lightweight. Moreover, the display device including the light-emitting diode as the display element has high contrast and a wide viewing angle; thus, high display quality can be obtained. Furthermore, with the use of an inorganic material as a light-emitting material, the lifetime of the display device can be extended and the reliability can be increased.

Note that in this specification and the like, a light-emitting diode whose chip area is less than or equal to 10000 $\mu m^2$ may be referred to as a micro LED, a light-emitting diode whose chip area is greater than 10000 $\mu m^2$ and less than or equal to 1 $mm^2$ may be referred to as a mini LED, and a light-emitting diode whose chip area is greater than 1 $mm^2$ may be referred to as a macro LED.

For example, a light-emitting diode whose chip external dimension is less than or equal to 100 $\mu m^2$ can be referred to as a micro LED (a micro LED chip). For example, a micro LED chip or a mini LED chip can be used in a 1-mm-square LED package.

Any of a micro LED, a mini LED, and a macro LED can be used in the display device of one embodiment of the present invention. In particular, the display device of one embodiment of the present invention preferably includes a micro LED or a mini LED, further preferably, a micro LED.

The chip area of the light-emitting diode is preferably less than or equal to 1 $mm^2$, further preferably less than or equal to 10000 $\mu m^2$, still further preferably less than or equal to 3000 $\mu m^2$, even further preferably less than or equal to 700 $\mu m^2$.

The area of a light-emitting region of the light-emitting diode is preferably less than or equal to 1 $mm^2$, further preferably less than or equal to 10000 $\mu m^2$, still further preferably less than or equal to 3000 $\mu m^2$, even further preferably less than or equal to 700 $\mu m^2$.

In this embodiment, in particular, an example of using a micro LED as the light-emitting diode is described. Note that in this embodiment, a micro LED having a double heterojunction is described. Note that there is no particular limitation on the light-emitting diode, and for example, a micro LED having a quantum well junction or a nanocolumn LED may be used.

The transistor included in the display device preferably includes a metal oxide in its channel formation region. The transistor using a metal oxide can have low power consumption. Thus, a combination with a micro LED can achieve a display device with significantly reduced power consumption.

Structure Example 1 of Display Device

FIG. 1(A) is a top view of a display device 100. The display device 100 includes a plurality of pixels 130 in a display unit 110. In the display unit 110, the plurality of pixels 130 are arranged in a matrix. Signals and power are supplied from an FPC1 and an FPC2 to the display unit 110 through a wiring 108.

Figure 1B:
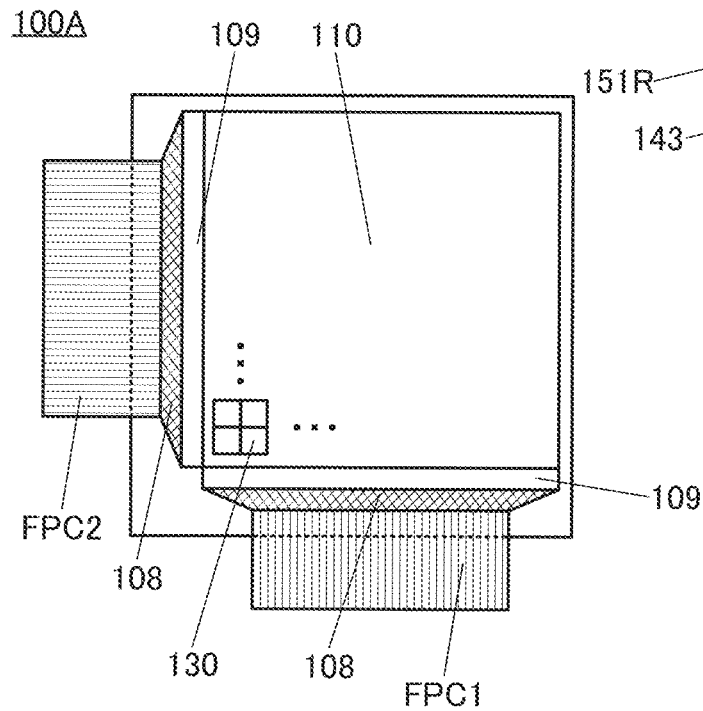

FIG. 1(B) is a top view of a display device 100A. The display device 100A includes a circuit 109 between the display unit 110 and the wiring 108. Signals and power are supplied from the FPC1 or the FPC2 to the display unit 110 and the circuit 109 through the wiring 108.

The display device of one embodiment of the present invention can incorporate one or both of a scan line driver circuit (gate driver) and a signal line driver circuit (source driver). Alternatively, the display device of one embodiment of the present invention can have a structure to which a driver is attached externally, without incorporating one or both of the gate driver and the source driver. For example, an IC functioning as a gate driver or a source driver can be electrically connected to the display device. The IC can be mounted on the display device by a COG method or a COF method. Alternatively, an FPC, a TAB (Tape Automated Bonding) tape, a TCP, or the like on which the IC is mounted can be connected to the display device.

One or both of the gate driver and the source driver can be applied as the circuit 109, for example.

Figure 1C:
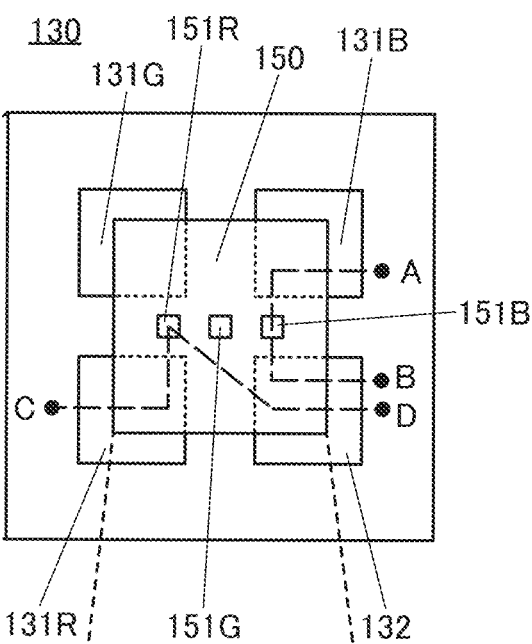

FIG. 1(C) is a top view of a pixel 130 included in the display device 100. One LED package 150 is provided in one pixel 130. In other words, a plurality of LED packages 150 are provided in a matrix in the display unit 110 illustrated in FIG. 1(A).

The pixel 130 includes a conductive layer 131R, a conductive layer 131G, a conductive layer 131B, a conductive layer 132, and the LED package 150.

Figure 1D:
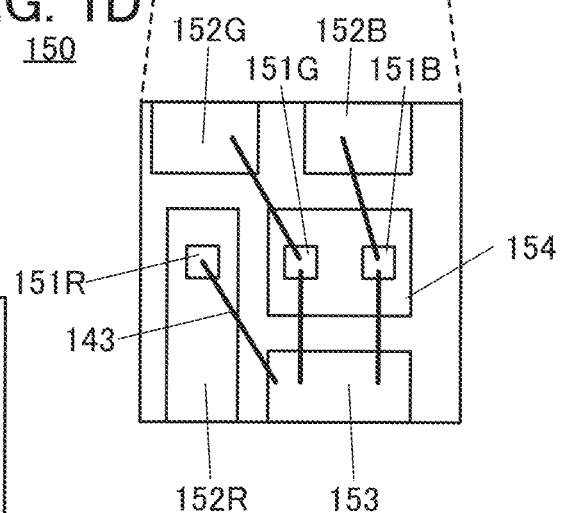

FIG. 1(D) is a top view of the LED package 150 included in the pixel 130.

The LED package 150 includes at least one LED chip. In this embodiment, the LED package 150 includes a red LED chip 151R, a green LED chip 151G, and a blue LED chip 151B, for example. That is, a structure in which one color is expressed by subpixels of three colors of R (red), G (green), and B (blue) is used in the pixel 130 in this embodiment.

Alternatively, a structure in which one color is expressed by subpixels of four colors of R, G, B, and W (white), or a structure in which one color is expressed by subpixels of four colors of R, G, B, and Y (yellow) can be used in the pixel 130. There is no particular limitation on the color element and colors other than R, G, B, W, and Y (e.g., cyan, magenta, or the like) may be used.

The LED package 150 further includes a heat sink 154, an electrode 152R, an electrode 152G, an electrode 152B, and an electrode 153.

The red LED chip 151R is positioned over the electrode 152R. The green LED chip 151G and the blue LED chip 151B are positioned over the heat sink 154.

Each of the red LED chip 151R, the green LED chip 151G, and the blue LED chip 151B is electrically connected to the electrode 153 through a wire 143.

The red LED chip 151R, the green LED chip 151G, and the blue LED chip 151B preferably include light-emitting diodes emitting light of different colors from each other. Thus, a step of forming a color conversion layer is not needed. Consequently, the manufacturing cost of the LED chips can be reduced.

Alternatively, the red LED chip 151R, the green LED chip 151G, and the blue LED chip 151B may include light-emitting diodes emitting light of the same color. At this time, light emitted from the light-emitting diode may be extracted to the outside of the display device through one or both of a color conversion layer and a coloring layer. One or both of the color conversion layer and the coloring layer can be provided inside or above the LED package 150.

The display device of this embodiment may include a light-emitting diode emitting infrared light. The light-emitting diode emitting infrared light can be used as a light source of an infrared light sensor, for example.

Figure 2A:
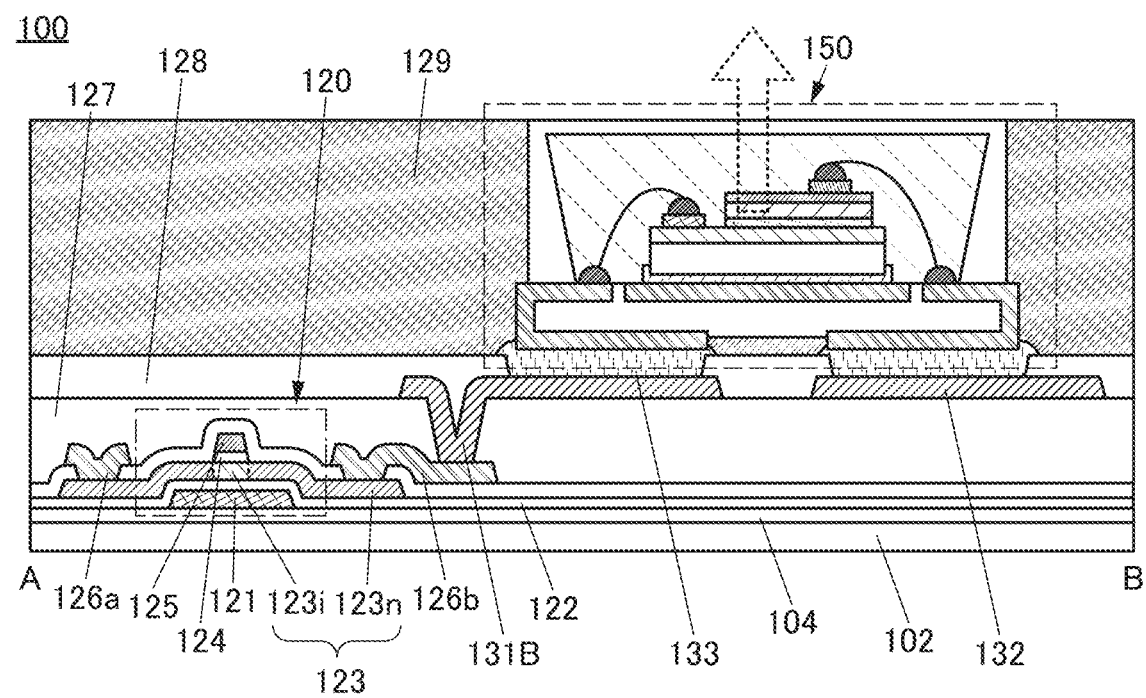
FIG. 2A is a cross-sectional view illustrating an example of a display device.

FIG. 2(A) is a cross-sectional view taken along a dashed-dotted line A-B in FIG. 1(C). In other words, FIG. 2(A) is a cross-sectional view including the blue LED chip 151B and the conductive layer 131B and the conductive layer 132 that are electrically connected to the blue LED chip 151B. Note that in FIG. 2(A), some components such as wirings are not illustrated for clarity.

Note that the following description can be referred to for a cross-sectional structure including the green LED chip 151G and the conductive layer 131G and the conductive layer 132 that are electrically connected to the green LED chip 151G because the cross-sectional structure is similar to that in FIG. 2(A).

As illustrated in FIG. 2(A), in the display device 100, a transistor 120 is electrically connected to the LED package 150 through the conductive layer 131B.

The transistor 120 includes a conductive layer 121 functioning as a back gate, an insulating layer 122 functioning as a gate insulating layer, a metal oxide layer 123 (a channel formation region 123i and a pair of low-resistance regions 123n) functioning as a semiconductor layer, a pair of conductive layers 126a and 126b each electrically connected to the low-resistance region 123n, an insulating layer 124 functioning as a gate insulating layer, and a conductive layer 125 functioning as a gate. The conductive layer 121 and the metal oxide layer 123 overlap with each other with the insulating layer 122 therebetween. The conductive layer 125 and the metal oxide layer 123 overlap with each other with the insulating layer 124 therebetween.

An insulating layer 127 is provided over the transistor 120, and the conductive layer 131B and the conductive layer 132 are provided over the insulating layer 127. The conductive layer 131B is electrically connected to the conductive layer 126b through an opening provided in the insulating layer 127.

A material through which impurities such as water or hydrogen are less likely to diffuse is preferably used for at least one of the insulating layer 124 and the insulating layer 127. Diffusion of impurities from the outside into the transistor can be effectively inhibited, leading to improved reliability of the display device. The insulating layer 127 functions as a planarization layer.

In FIG. 2(A), the transistor 120 is provided over a substrate 102 with an insulating layer 104 therebetween. The insulating layer 104 functions as a base film. The insulating layer 104 functions as a barrier layer that inhibits diffusion of impurities such as water and hydrogen from the substrate 102 into the transistor 120 and release of oxygen from the metal oxide layer 123 to the insulating layer 104 side. As the insulating layer 104, a film through which hydrogen or oxygen is less likely to diffuse than through a silicon oxide film, such as an aluminum oxide film, a hafnium oxide film, or a silicon nitride film, can be used, for example. Note that the transistor 120 may be directly formed on the substrate 102 without the insulating layer 104.

An end portion of the conductive layer 131B and an end portion of the conductive layer 132 are covered with a protective layer 128. The protective layer 128 includes an opening reaching the top surface of the conductive layer 131B and an opening reaching the top surface of the conductive layer 132. In the openings, the conductive layer 131B and the conductive layer 132 are each electrically connected to the LED package 150 through a conductor 133.

A resin such as an acrylic, a polyimide, an epoxy, or a silicone is suitable as the material of the protective layer 128. When the protective layer 128 is provided, a short circuit caused by contact of the conductor 133 over the conductive layer 131B with the conductor 133 over the conductive layer 132 can be inhibited. Note that the protective layer 128 is not necessarily provided.

A conductive paste of silver, carbon, copper, or the like or a bump of gold, solder, or the like can be suitably used for the conductors 133, for example. Furthermore, a conductive material that has a low contact resistance with the conductor 133 is preferably used as each of the conductive layers 131R, 131G, 131B, and 132, and the electrodes 152R, 152G, 152B, and 153, which are connected to the conductor 133. In the case where a silver paste is used for the conductors 133, for example, a conductive material connected to these is preferably aluminum, titanium, copper, an alloy containing silver (Ag), palladium (Pd), and copper (Cu) (Ag—Pd—Cu (APC)), or the like because they have a low contact resistance.

The conductor 133 may be provided over the substrate 102 or may be provided on the LED package 150 side. For example, the conductor 133 is provided over each of the conductive layers 131R, 131G, 131B, and 132, and then the conductor 133 is connected to the LED package 150, whereby the LED package 150 can be mounted on the substrate 102.

Note that a plurality of light-emitting diodes may be electrically connected to one transistor.

The side surface of the LED package 150 may be covered with a resin 129. A black resin is preferable as the resin 129, in which case display contrast can be increased. In addition, a surface protective layer, an impact absorption layer, or the like may be provided over the top surface of the LED package 150. Since the LED package 150 has a structure in which light is extracted to the upper side, the layer provided over the top surface of the LED package 150 preferably has a transmitting property with respect to visible light.

An insulating substrate such as a glass substrate, a quartz substrate, a sapphire substrate, or a ceramic substrate; a single crystal semiconductor substrate or a polycrystalline semiconductor substrate including silicon, silicon carbide, or the like as a material; a compound semiconductor substrate of silicon germanium or the like; or a semiconductor substrate such as an SOI substrate can be used as the substrate 102.

The substrate 102 preferably blocks visible light (has a non-transmitting property with respect to visible light). When the substrate 102 blocks visible light, the entry of light from the outside into the transistor 120 formed over the substrate 102 can be inhibited. However, one embodiment of the present invention is not limited thereto, and the substrate 102 may have a transmitting property with respect to visible light.

In addition, the substrate 102 may include one and both of a reflective layer that reflects light of a light-emitting diode and a light-blocking layer that blocks the light.

The plurality of light-emitting diodes (LED chips) included in the LED package 150 may be driven by transistors having the same structure or may be driven by transistors having different structures. For example, a transistor that drives the red LED chip 151R, a transistor that drives the green LED chip 151G, and a transistor that drives the blue LED chip 151B may differ in at least one of the size, channel length, channel width, structure, and the like of the transistor. Specifically, depending on the amount of current required for light emission with desired luminance, one or both of the channel length and the channel width of the transistor may be changed for each color.

As materials that can be used for the conductive layers included in the display device of this embodiment, any of metals such as aluminum, titanium, chromium, nickel, copper, yttrium, zirconium, molybdenum, silver, tantalum, and tungsten, an alloy containing any of these metals as its main component, or the like can be used. A single-layer structure or stacked-layer structure including a film containing any of these materials can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which an aluminum film or a copper film is stacked over a titanium film or a titanium nitride film and a titanium film or a titanium nitride film is formed thereover, a three-layer structure in which an aluminum film or a copper film is stacked over a molybdenum film or a molybdenum nitride film and a molybdenum film or a molybdenum nitride film is formed thereover, and the like can be given. Note that an oxide such as indium oxide, tin oxide, or zinc oxide may be used. Furthermore, copper containing manganese is preferably used because it increases controllability of a shape by etching.

Examples of a material that can be used for the insulating layers included in the display device of this embodiment include a resin such as an acrylic, a polyimide, an epoxy, or a silicone, and an inorganic insulating material such as silicon oxide, silicon oxynitride, silicon nitride oxide, silicon nitride, or aluminum oxide.

The LED package 150 is described in more detail with reference to FIG. 2(B). The blue LED chip 151B is described in more detail with reference to FIG. 2(C).

Figure 2B:
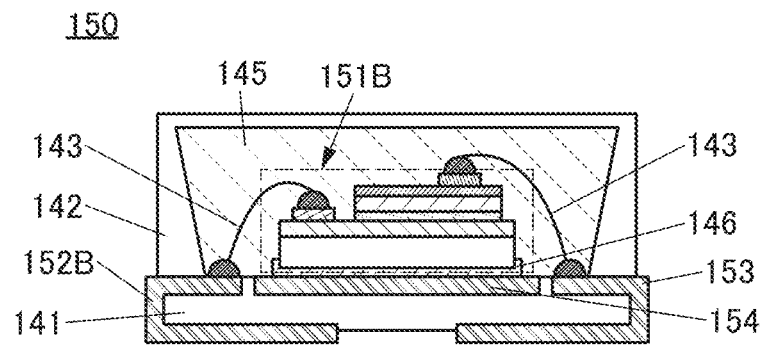
FIG. 2B is a cross-sectional view illustrating an example of an LED package.

The LED package 150 illustrated in FIG. 2(B) includes a substrate 141, the blue LED chip 151B, the electrode 152B, the electrode 153, the heat sink 154, an adhesive layer 146, a case 142, the wire 143, a wire 144, and a sealing layer 145.

The blue LED chip 151B is attached over the substrate 141 with the adhesive layer 146. The blue LED chip 151B is provided to overlap with the heat sink 154 with the adhesive layer 146 therebetween. There is no particular limitation on the material of the adhesive layer 146; however, since the red LED chip 151R is attached to the electrode 152R to be electrically connected to the electrode 152R as described later, it is preferable that the adhesive layer 146 have conductivity, in which case the materials of the adhesive layers 146 of the LED chips of every color can be uniform. In the blue LED chip and the green LED chip, it is preferable to use an adhesive having conductivity as the adhesive layer 146, in which case heat dissipation is increased. The heat sink 154 can be formed using the same material by the same step as those of the electrode 152B and the electrode 153.

As the substrate 141, a glass epoxy resin substrate, a polyimide substrate, a ceramic substrate, an alumina substrate, an aluminum nitride substrate, or the like can be used.

Figure 2C:
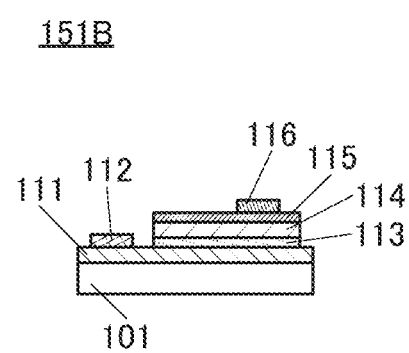
FIG. 2C is a cross-sectional view illustrating an example of an LED chip.

The blue LED chip 151B illustrated in FIG. 2(C) has a structure in which a light-emitting diode (LED) is provided over a substrate 101. The light-emitting diode includes a semiconductor layer 111, an electrode 112, a light-emitting layer 113, a semiconductor layer 114, an electrode 115, and an electrode 116.

The electrode 112 is electrically connected to the semiconductor layer 111. The electrode 116 is electrically connected to the semiconductor layer 114 through the electrode 115. Only one of the electrode 115 and the electrode 116 may be provided. The light-emitting layer 113 is sandwiched between the semiconductor layer 111 and the semiconductor layer 114. In the light-emitting layer 113, electrons and holes are combined to emit light. One of the semiconductor layer 111 and the semiconductor layer 114 is an n-type semiconductor layer, and the other is a p-type semiconductor layer.

The stacked-layer structure including the semiconductor layer 111, the light-emitting layer 113, and the semiconductor layer 114 in the blue LED chip 151B is formed to emit blue light.

Note that in the light-emitting diode of each color, a stacked-layer structure including a pair of semiconductor layers and a light-emitting layer between the pair of semiconductor layers is formed to emit light of red, yellow, green, blue, or the like. For the stacked-layer structure, a compound of gallium and phosphorus, a compound of gallium and arsenic, a compound of gallium, aluminum, and arsenic, a compound of aluminum, gallium, indium, and phosphorus, gallium nitride, a compound of indium and gallium nitride, a compound of selenium and zinc, or the like can be used, for example.

As the substrate 101, a single crystal substrate such as a sapphire ($Al_2O_3$) substrate, a silicon carbide (SiC) substrate, a silicon (Si) substrate, a gallium nitride (GaN) substrate, or the like can be used, for example.

The electrode 112 is electrically connected to the electrode 152B through the wire 143. The electrode 112 functions as a pixel electrode of the light-emitting diode. The electrode 116 is electrically connected to the electrode 153 through the wire 144. The electrode 116 functions as a common electrode of the light-emitting diode.

Each of the electrode 152B and the electrode 153 can be formed using an element selected from nickel, copper, silver, platinum, or gold, or an alloy material containing the element at 50% or more.

A thermocompression method or a wire bonding method using an ultrasonic bonding method can be used for each of connection between the electrode 152B and the electrode 112 and connection between the electrode 153 and the electrode 116.

For each of the wire 143 and the wire 144, a metal thin wire formed of gold, an alloy containing gold, copper, an alloy containing copper, or the like can be used.

A resin can be used as the material of the case 142. The case 142 needs to cover at least the side surface of the blue LED chip 151B and does not necessarily overlap with the top surface of the blue LED chip 151B. For example, the sealing layer 145 may be exposed on the top surface side of the blue LED chip 151B. A reflector made of ceramics or the like is preferably provided on an inner side surface of the case 142, specifically, in the periphery of the blue LED chip 151B. Part of light emitted by the blue LED chip 151B is reflected by the reflector, so that a larger amount of light can be extracted from the LED package 150.

The inside of the case 142 is filled with the sealing layer 145. A resin having a transmitting property with respect to visible light is suitable as the sealing layer 145. For example, an ultraviolet curable resin such as an epoxy resin or a silicone resin or a visible light curable resin can be used for the sealing layer 145.

Figure 3A:
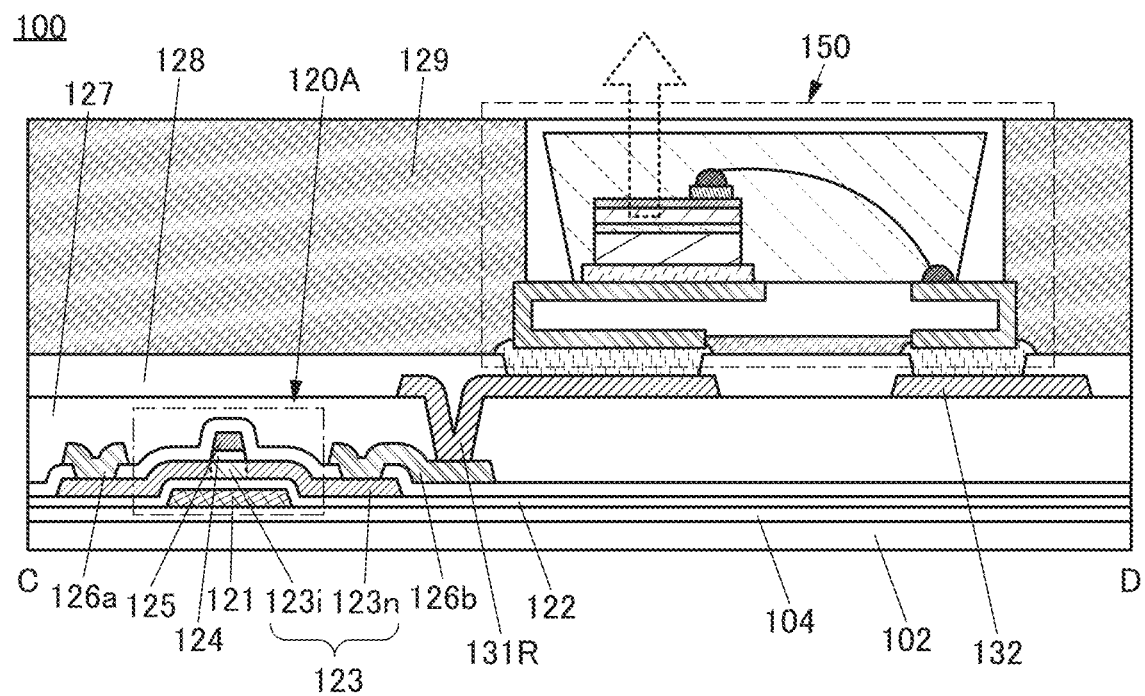
FIG. 3A is a cross-sectional view illustrating an example of a display device.

FIG. 3(A) is a cross-sectional view taken along a dashed-dotted line C-D in FIG. 1(C). In other words, FIG. 3(A) is a cross-sectional view including the red LED chip 151R and the conductive layer 131R and the conductive layer 132 that are electrically connected to the red LED chip 151R. Note that in FIG. 3(A), some components such as wirings are not shown for clarity.

As illustrated in FIG. 3(A), in the display device 100, a transistor 120A is electrically connected to the LED package 150 through the conductive layer 131R.

The transistor 120A has the same structure as the transistor 120 illustrated in FIG. 2(A); thus, the detailed description thereof is omitted.

The insulating layer 127 is provided over the transistor 120A, and the conductive layer 131R and the conductive layer 132 are provided over the insulating layer 127. The conductive layer 131R is electrically connected to the conductive layer 126b through an opening provided in the insulating layer 127.

Each of the conductive layer 131R and the conductive layer 132 is electrically connected to the LED package 150 through the conductor 133.

The LED package 150 is described in more detail with reference to FIG. 3(B). The red LED chip 151R is described in more detail with reference to FIG. 3(C).

Figure 3B:
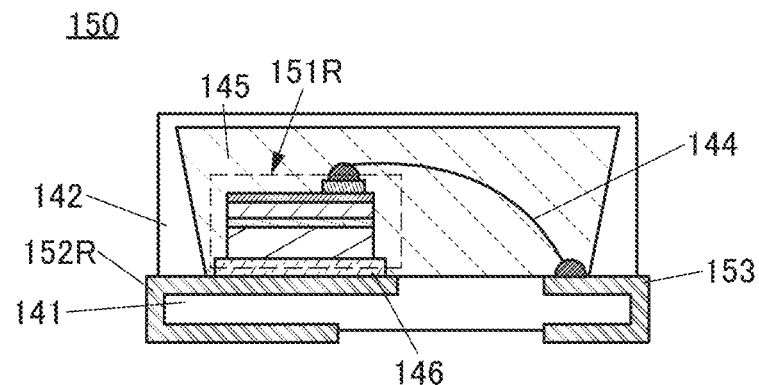
FIGS. 3B and 3D are cross-sectional views illustrating examples of an LED package.

The LED package 150 illustrated in FIG. 3(B) includes the substrate 141, the red LED chip 151R, the electrode 152R, the electrode 153, the adhesive layer 146, the case 142, the wire 144, and the sealing layer 145.

The red LED chip 151R is electrically connected to the electrode 152R through the adhesive layer 146 having conductivity.

Figure 3C:
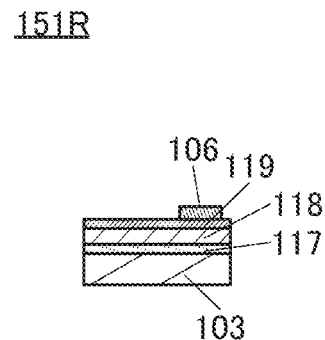
FIG. 3C is a cross-sectional view illustrating an example of an LED chip.

The red LED chip 151R illustrated in FIG. 3(C) includes an electrode 103, a semiconductor layer 117, a light-emitting layer 118, a semiconductor layer 119, and an electrode 106. The red LED chip 151R can also be referred to as a light-emitting diode (LED). Furthermore, the red LED chip may have a structure in which a light-emitting diode is provided over a conductive substrate.

The electrode 103 is electrically connected to the semiconductor layer 117. The electrode 106 is electrically connected to the semiconductor layer 119. The light-emitting layer 118 is sandwiched between the semiconductor layer 117 and the semiconductor layer 119. In the light-emitting layer 118, electrons and holes are combined to emit light. One of the semiconductor layer 117 and the semiconductor layer 119 is an n-type semiconductor layer, and the other is a p-type semiconductor layer.

The electrode 103 is electrically connected to the electrode 152R through the adhesive layer 146. The electrode 103 functions as a pixel electrode of the light-emitting diode. The electrode 106 is electrically connected to the electrode 153 through the wire 144. The electrode 106 functions as a common electrode of the light-emitting diode.

Figure 3D:
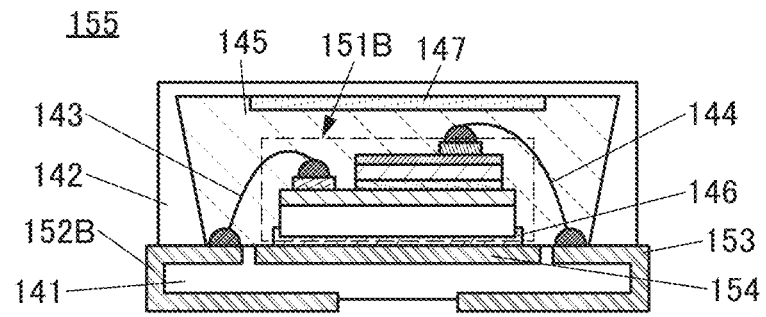

A color conversion layer 147 may be provided inside the case 142, as in an LED package 155 illustrated in FIG. 3(D). Thus, light of the light-emitting diode is emitted to the outside of the LED package 155 through the color conversion layer 147.

Note that although a structure in which the color conversion layer 147 is provided above the sealing layer 145 is illustrated in FIG. 3(D), the position of the color conversion layer 147 is not limited thereto. For example, the color conversion layer 147 may be separated inside the sealing layer 145.

A phosphor or a quantum dot (QD) is preferably used for the color conversion layer 147. In particular, a quantum dot has an emission spectrum with a narrow peak, so that emission with high color purity can be obtained. Accordingly, the display quality of the display device can be improved.

For example, in the case where a plurality of LED chips included in the LED package 155 each include a light-emitting diode emitting blue light, the color conversion layer 147 is preferably provided inside or above the LED package 155. Specifically, it is preferable that the color conversion layer 147 which converts blue light into red light be provided in a position overlapping with the red LED chip 151R, and the color conversion layer 147 which converts blue light into green light be provided in a position overlapping with the green LED chip 151G.

Thus, light emitted by the light-emitting diode in the red subpixel is converted from blue into red by the color conversion layer 147 and emitted to the outside of the display device. Furthermore, light emitted by the light-emitting diode in the green subpixel is converted from blue into green by the color conversion layer 147 and emitted to the outside of the display device. Blue light emitted by the light-emitting diode in the blue subpixel is directly emitted to the outside of the display device.

The color conversion layer 147 can be formed by a droplet discharge method (e.g., an inkjet method), a coating method, an imprinting method, a variety of printing methods (screen printing or offset printing), or the like. A color conversion film such as a quantum dot film may also be used.

As the phosphor, an organic resin layer having a surface on which a phosphor is printed or which is coated with a phosphor, an organic resin layer mixed with a phosphor, or the like can be used.

There is no limitation on a material of a quantum dot, and examples include a Group 14 element, a Group 15 element, a Group 16 element, a compound of a plurality of Group 14 elements, a compound of an element belonging to any of Groups 4 to 14 and a Group 16 element, a compound of a Group 2 element and a Group 16 element, a compound of a Group 13 element and a Group 15 element, a compound of a Group 13 element and a Group 17 element, a compound of a Group 14 element and a Group 15 element, a compound of a Group 11 element and a Group 17 element, iron oxides, titanium oxides, spinel chalcogenides, and semiconductor clusters.

Specific examples include cadmium selenide; cadmium sulfide; cadmium telluride; zinc selenide; zinc oxide; zinc sulfide; zinc telluride; mercury sulfide; mercury selenide; mercury telluride; indium arsenide; indium phosphide; gallium arsenide; gallium phosphide; indium nitride; gallium nitride; indium antimonide; gallium antimonide; aluminum phosphide; aluminum arsenide; aluminum antimonide; lead selenide; lead telluride; lead sulfide; indium selenide; indium telluride; indium sulfide; gallium selenide; arsenic sulfide; arsenic selenide; arsenic telluride; antimony sulfide; antimony selenide; antimony telluride; bismuth sulfide; bismuth selenide; bismuth telluride; silicon; silicon carbide; germanium; tin; selenium; tellurium; boron; carbon; phosphorus; boron nitride; boron phosphide; boron arsenide; aluminum nitride; aluminum sulfide; barium sulfide; barium selenide; barium telluride; calcium sulfide; calcium selenide; calcium telluride; beryllium sulfide; beryllium selenide; beryllium telluride; magnesium sulfide; magnesium selenide; germanium sulfide; germanium selenide; germanium telluride; tin sulfide; tin selenide; tin telluride; lead oxide; copper fluoride; copper chloride; copper bromide; copper iodide; copper oxide; copper selenide; nickel oxide; cobalt oxide; cobalt sulfide; iron oxide; iron sulfide; manganese oxide; molybdenum sulfide; vanadium oxide; tungsten oxide; tantalum oxide; titanium oxide; zirconium oxide; silicon nitride; germanium nitride; aluminum oxide; barium titanate; a compound of selenium, zinc, and cadmium; a compound of indium, arsenic, and phosphorus; a compound of cadmium, selenium, and sulfur; a compound of cadmium, selenium, and tellurium; a compound of indium, gallium, and arsenic; a compound of indium, gallium, and selenium; a compound of indium, selenium, and sulfur; a compound of copper, indium, and sulfur; and combinations thereof. What is called an alloyed quantum dot whose composition is represented by a given ratio may be used.

Examples of the quantum dot include core-type quantum dots, core-shell quantum dots, and core-multishell quantum dots. Quantum dots have a high proportion of surface atoms and thus have high reactivity and easily aggregate together. For this reason, it is preferable that a protective agent be attached to or a protective group be provided on the surfaces of the quantum dots. The attachment of the protective agent or the provision of the protective group can prevent cohesion and increase solubility in a solvent. It can also reduce reactivity and improve electrical stability.

Since band gaps of quantum dots are increased as their size is decreased, the size is adjusted as appropriate so that light with a desired wavelength can be obtained. Light emission from the quantum dots is shifted to a blue color side, i.e., a high energy side, as the crystal size becomes smaller; thus, the emission wavelengths of the quantum dots can be adjusted over a wavelength range of a spectrum of an ultraviolet region, a visible light region, and an infrared region by changing the size of quantum dots. The size (diameter) of the quantum dots is, for example, greater than or equal to 0.5 nm and less than or equal to 20 nm, preferably greater than or equal to 1 nm and less than or equal to 10 nm. The emission spectra are narrowed as the size distribution of the quantum dots gets smaller, and thus light can be obtained with high color purity. The shape of the quantum dots is not particularly limited and may be a spherical shape, a rod shape, a circular shape, or the like. Quantum rods, which are rod-shaped quantum dots, have a function of emitting directional light.

Alternatively, a stacked-layer structure of the color conversion layer 147 and a coloring layer may be provided inside or above the LED package 155. Thus, light that has been converted by the color conversion layer 147 passes through the coloring layer, whereby the purity of light can be increased. In addition, a blue coloring layer may be provided in a position overlapping with the blue LED chip 151B. When a blue coloring layer is provided, the purity of blue light can be increased. In the case where a blue coloring layer is not provided, the manufacturing process can be simplified.

The coloring layer is a colored layer that transmits light in a specific wavelength range. For example, a color filter that transmits light in a red, green, blue, or yellow wavelength range can be used. Examples of a material that can be used for the coloring layer include a metal material, a resin material, and a resin material containing a pigment or a dye.

Structure Example 2 of Display Device

Figure 4:
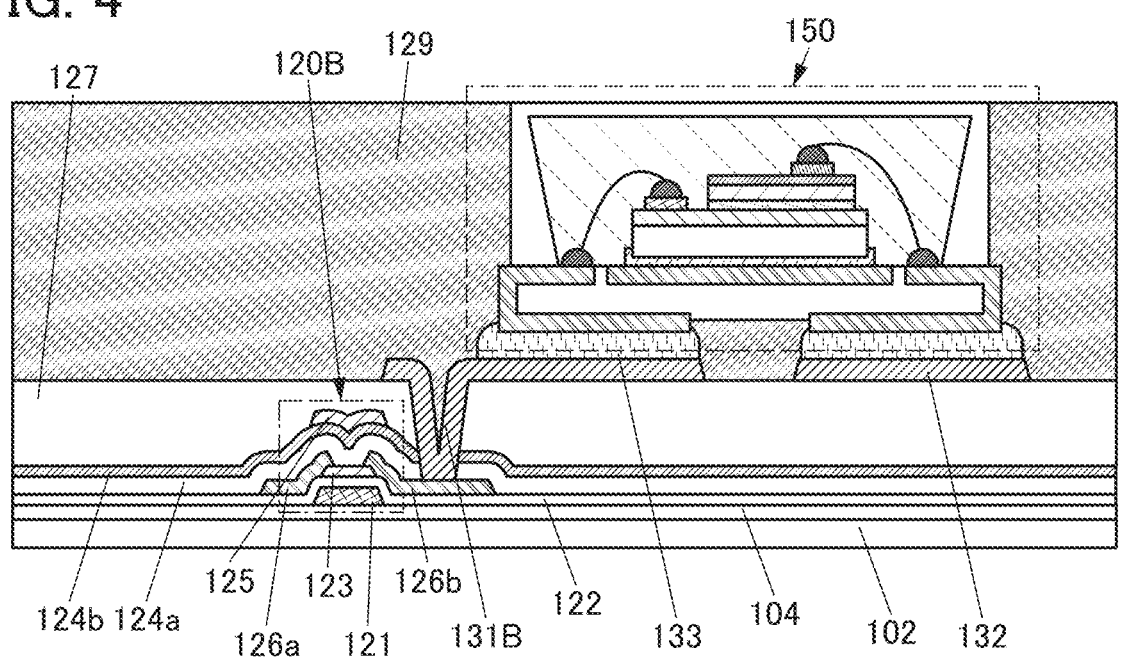
FIG. 4 is a cross-sectional view illustrating an example of a display device.
Figure 5:
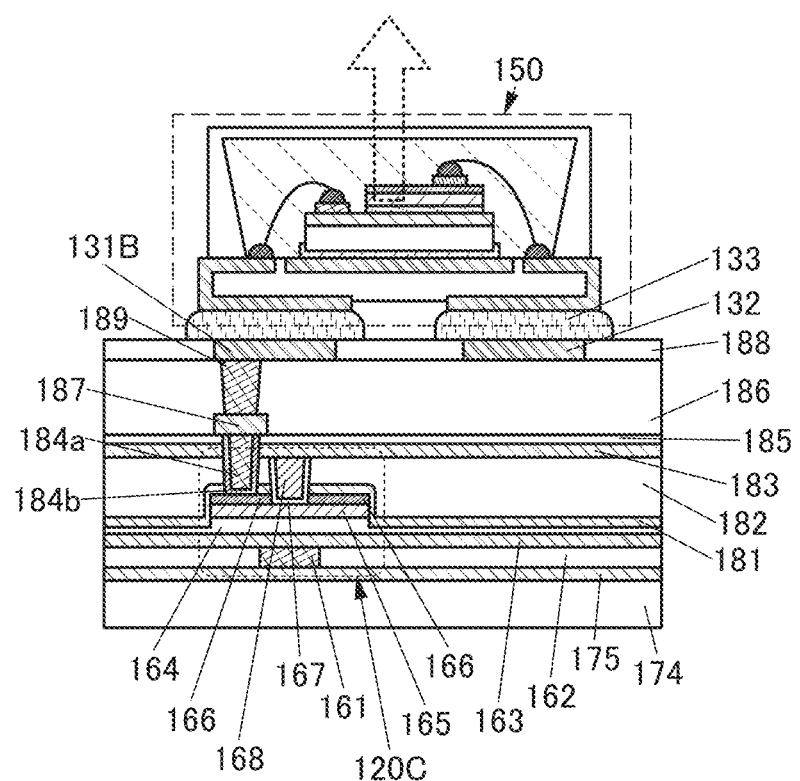
FIG. 5 is a cross-sectional view illustrating an example of a display device.
Figure 6:
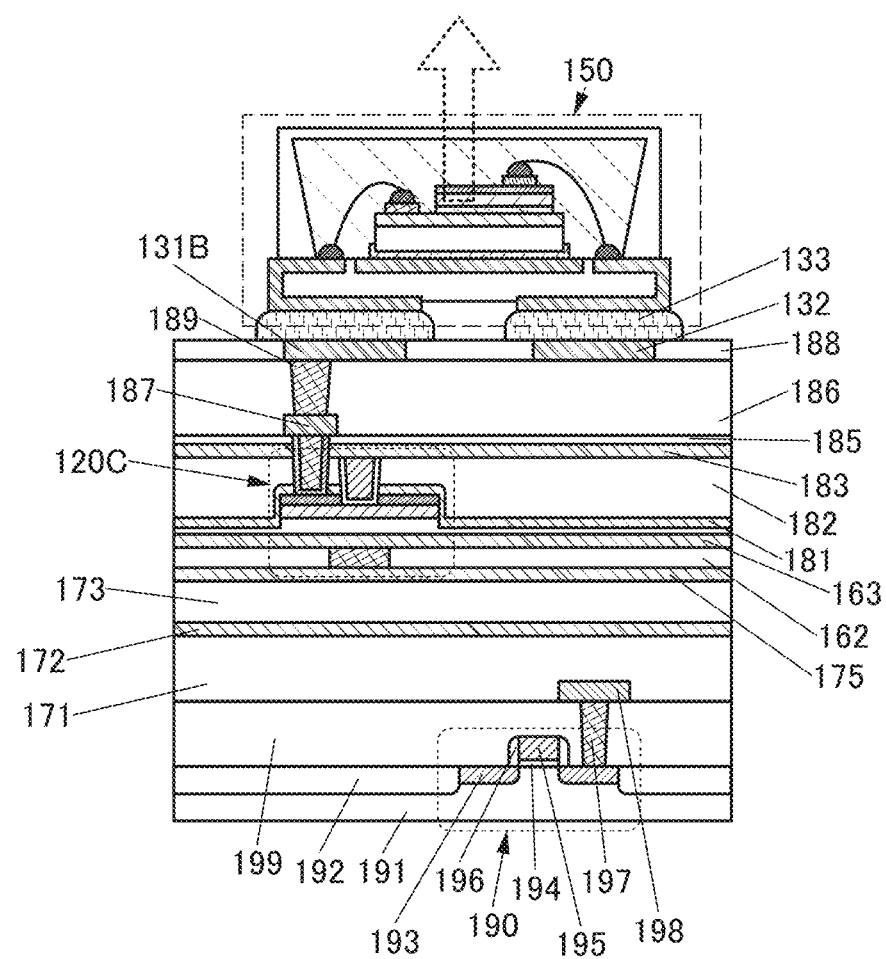
FIG. 6 is a cross-sectional view illustrating an example of a display device.

FIG. 4 to FIG. 6 each illustrate an example of a cross-sectional structure of a display device different from that in Structure example 1 of display device.

The display devices illustrated in FIG. 4 to FIG. 6 are different from that in FIG. 2(A) mainly in the structure of the transistor electrically connected to the LED package 150.

In the display device illustrated in FIG. 4, a transistor 120B is electrically connected to the LED package 150 through the conductive layer 131B.

The transistor 120B includes the conductive layer 121 functioning as a gate, the insulating layer 122 functioning as a gate insulating layer, the metal oxide layer 123 functioning as a semiconductor layer, the pair of conductive layers 126a and 126b functioning as a source and a drain, insulating layers 124a and 124b functioning as gate insulating layers, and the conductive layer 125 functioning as a back gate. The conductive layer 121 and the metal oxide layer 123 overlap with each other with the insulating layer 122 therebetween. The conductive layer 125 and the metal oxide layer 123 overlap with each other with the insulating layer 124a and the insulating layer 124b therebetween.

The insulating layer 127 is provided over the transistor 120B, and the conductive layer 131B and the conductive layer 132 are provided over the insulating layer 127. The conductive layer 131B is electrically connected to the conductive layer 126b through an opening provided in the insulating layer 127.

In the display device illustrated in FIG. 5, a transistor 120C is electrically connected to the LED package 150 through the conductive layer 131B and the like.

An insulating layer 175, the transistor 120C, a conductive layer 184a, a conductive layer 184b, a conductive layer 187, a conductive layer 189, an insulating layer 186, an insulating layer 188, the conductive layer 131B, the conductive layer 132, and the like are provided over a substrate 174. Insulating layers such as an insulating layer 162, an insulating layer 181, an insulating layer 182, an insulating layer 183, and an insulating layer 185 are further provided over the substrate 174. One or more of these insulating layers are sometimes considered as components of a transistor, but are not included as components of a transistor in the description in this embodiment.

An insulating substrate such as a glass substrate, a quartz substrate, a sapphire substrate, or a ceramic substrate; a single crystal semiconductor substrate or a polycrystalline semiconductor substrate including silicon, silicon carbide, or the like as a material; a compound semiconductor substrate of silicon germanium or the like; or a semiconductor substrate such as an SOI substrate can be used as a substrate 151.

The substrate 151 preferably blocks visible light (has a non-transmitting property with respect to visible light). When the substrate 151 blocks visible light, entry of light from the outside into the transistor 120C formed over the substrate 151 can be inhibited. However, one embodiment of the present invention is not limited thereto, and the substrate 151 may have a transmitting property with respect to visible light.

The insulating layer 175 is provided over the substrate 174. The insulating layer 175 functions as a barrier layer that inhibits diffusion of impurities such as water and hydrogen from the substrate 174 into the transistor 120C and release of oxygen from a metal oxide layer 165 to the insulating layer 175 side. As the insulating layer 175, a film through which hydrogen or oxygen is less likely to diffuse than through a silicon oxide film, such as an aluminum oxide film, a hafnium oxide film, and a silicon nitride film, can be used, for example.

The transistor 120C includes a conductive layer 161, an insulating layer 163, an insulating layer 164, the metal oxide layer 165, a pair of conductive layers 166, an insulating layer 167, a conductive layer 168, and the like.

The metal oxide layer 165 includes a channel formation region. The metal oxide layer 165 includes a first region overlapping with one of the pair of conductive layers 166, a second region overlapping with the other of the pair of conductive layers 166, and a third region between the first region and the second region.

The conductive layer 161 and the insulating layer 162 are provided over the insulating layer 175, and the insulating layer 163 and the insulating layer 164 are provided to cover the conductive layer 161 and the insulating layer 162. The metal oxide layer 165 is provided over the insulating layer 164. The conductive layer 161 functions as a gate electrode, and the insulating layer 163 and the insulating layer 164 function as gate insulating layers. The conductive layer 161 overlaps with the metal oxide layer 165 with the insulating layer 163 and the insulating layer 164 therebetween. The insulating layer 163 preferably functions as a barrier layer like the insulating layer 175. As the insulating layer 164 in contact with the metal oxide layer 165, an oxide insulating film such as a silicon oxide film is preferably used.

Here, the height of the top surface of the conductive layer 161 is substantially the same as the height of the top surface of the insulating layer 162. For example, an opening is provided in the insulating layer 162, the conductive layer 161 is formed to fill the opening, and then planarization treatment is performed by a CMP method or the like, whereby the height of the top surface of the conductive layer 161 and the height of the top surface of the insulating layer 162 can be aligned with each other. Accordingly, the size of the transistor 120C can be reduced.

The pair of conductive layers 166 is provided over the metal oxide layer 165 to be apart from each other. The pair of conductive layers 166 functions as a source and a drain. The insulating layer 181 is provided to cover the metal oxide layer 165 and the pair of conductive layers 166, and the insulating layer 182 is provided over the insulating layer 181. An opening reaching the metal oxide layer 165 is provided in the insulating layer 181 and the insulating layer 182, and the insulating layer 167 and the conductive layer 168 are embedded in the opening. The opening overlaps with the third region. The insulating layer 167 overlaps with a side surface of the insulating layer 181 and a side surface of the insulating layer 182. The conductive layer 168 overlaps with the side surface of the insulating layer 181 and the side surface of the insulating layer 182 with the insulating layer 167 therebetween. The conductive layer 168 functions as a gate electrode, and the insulating layer 167 functions as a gate insulating layer. The conductive layer 168 overlaps with the metal oxide layer 165 with the insulating layer 167 therebetween.

Here, the height of the top surface of the conductive layer 168 is substantially the same as the height of the top surface of the insulating layer 182. For example, an opening is provided in the insulating layer 182, the insulating layer 167 and the conductive layer 168 are formed to fill the opening, and then planarization treatment is performed, whereby the height of the top surface of the conductive layer 168 and the height of the top surface of the insulating layer 182 can be aligned with each other. Accordingly, the size of the transistor 120C can be reduced.

The insulating layer 183 and the insulating layer 185 are provided to cover the top surfaces of the insulating layer 182, the insulating layer 167, and the conductive layer 168. The insulating layer 181 and the insulating layer 183 preferably function as barrier layers like the insulating layer 175. When the pair of conductive layers 166 is covered with the insulating layer 181, oxidation of the pair of conductive layers 166 due to oxygen contained in the insulating layer 182 can be inhibited.

A plug electrically connected to one of the pair of conductive layers 166 and the conductive layer 187 is embedded in an opening provided in the insulating layer 181, the insulating layer 182, the insulating layer 183, and the insulating layer 185. The plug preferably includes the conductive layer 184a in contact with the side surface of the opening and the top surface of one of the pair of conductive layers 166, and the conductive layer 184b embedded inside the conductive layer 184a. In this case, a conductive material through which hydrogen and oxygen are less likely to diffuse is preferably used for the conductive layer 184a.

The conductive layer 187 is provided over the insulating layer 185, and the insulating layer 186 is provided over the conductive layer 187. An opening reaching the conductive layer 187 is provided in the insulating layer 186, and the conductive layer 189 is embedded in the opening. The conductive layer 189 functions as a plug that electrically connects the conductive layer 187 and the conductive layer 131B.

One of the pair of conductive layers 166 is electrically connected to the conductive layer 131B through the conductive layer 184a, the conductive layer 184b, the conductive layer 187, and the conductive layer 189.

As described above, in the transistor 120C illustrated in FIG. 5, the height of the top surface of the conductive layer 161 is substantially the same as the height of the top surface of the insulating layer 162. Furthermore, in the transistor 120C illustrated in FIG. 5, the height of the top surface of the conductive layer 168 is substantially the same as the height of the top surface of the insulating layer 182.

In this manner, the display device of this embodiment preferably includes a transistor in which the height of the top surface of a gate electrode is substantially the same as the height of the top surface of an insulating layer. By planarization treatment employing a CMP (Chemical Mechanical Polishing) method or the like, for example, the top surfaces of the gate electrode and the insulating layer are planarized, so that the height of the top surface of the gate electrode and the height of the top surface of the insulating layer can be aligned with each other.

A transistor with such a structure can be easily reduced in size. When the size of a transistor is reduced, the size of a pixel can be reduced, so that the resolution of the display device can be increased.

In the display device illustrated in FIG. 6, the transistor 120C is electrically connected to the LED package 150 through the conductive layer 131B and the like, as in the display device illustrated in FIG. 5.

The display device illustrated in FIG. 6 includes a stack of a transistor 190 having a channel formation region in the substrate 191 and the transistor 120C having a channel formation region in a metal oxide.

As the substrate 191, a single crystal silicon substrate is suitably used. The transistor 190 includes a conductive layer 195, an insulating layer 194, an insulating layer 196, and a pair of low-resistance regions 193. The conductive layer 195 functions as a gate. The insulating layer 194 is positioned between the conductive layer 195 and the substrate 191 and functions as a gate insulating layer. The insulating layer 196 is provided to cover a side surface of the conductive layer 195 and functions as a side wall. The pair of low-resistance regions 193 are regions in the substrate 191 that are doped with an impurity. One of the pair of low-resistance regions 193 functions as a source of the transistor 190 the other functions as a drain of the transistor 190.

An element isolation layer 192 is provided between two adjacent transistors to be embedded in the substrate 191.

An insulating layer 199 is provided to cover the transistor 190, and a conductive layer 198 is provided over the insulating layer 199. The conductive layer 198 is electrically connected to one of the pair of low-resistance regions 193 through an opening in the insulating layer 199. An insulating layer 171 is provided to cover the conductive layer 198, and a conductive layer 172 is provided over the insulating layer 171. The conductive layer 198 and the conductive layer 172 each function as a wiring. An insulating layer 173 and the insulating layer 175 are provided to cover the conductive layer 172, and the transistor 120C is provided over the insulating layer 175. The stacked-layer structure from the insulating layer 175 to the LED package 150 is the same as that of the display device illustrated in FIG. 5; thus, detailed description thereof is omitted.

The transistor 120C can be used as a transistor included in a pixel circuit. The transistor 190 can be used as a transistor included in a pixel circuit or a transistor included in a driver circuit (one or both of a gate driver and a source driver) for driving the pixel circuit. The transistor 120C and the transistor 190 can each be used as a transistor included in a variety of circuits such as an arithmetic circuit and a memory circuit.

With such a structure, not only the pixel circuit but also the driver circuit or the like can be formed directly under the light-emitting diode; thus, the display device can be downsized as compared with the case where the driver circuit is provided outside a display unit. In addition, the display device can have a narrow frame (narrow non-display region).

The display device of one embodiment of the present invention may be a display device in which a touch sensor is mounted (also referred to as an input/output device or a touch panel). The structures of the display devices described above can be used for the touch panel.

There is no particular limitation on a detection element (also referred to as a sensor element) included in the touch panel of one embodiment of the present invention. A variety of sensors capable of sensing an approach or a contact of a sensing target such as a finger or a stylus can be used as the detection element.

For example, a variety of types such as a capacitive type, a resistive type, a surface acoustic wave type, an infrared type, an optical type, and a pressure-sensitive type can be used for the sensor.

Examples of the capacitive sensor include a surface capacitive sensor and a projected capacitive sensor. Examples of the projected capacitive sensor include a self-capacitive sensor and a mutual capacitive sensor. The use of a mutual capacitive sensor is preferred because multiple points can be sensed simultaneously.

The touch panel of one embodiment of the present invention can have a variety of structures, including a structure in which a display device and a detection element that are separately formed are attached to each other and a structure in which electrodes and the like included in a detection element are provided on one or both of a substrate supporting a display element and a counter substrate.

As described above, the display device of this embodiment can be manufactured in such a manner that an LED package is mounted on a substrate over which a plurality of transistors are formed; thus, the degree of difficulty of manufacture of the display device can be reduced, and the yield can be improved. Moreover, with a combination of a micro LED and a transistor using a metal oxide, a display device with reduced power consumption can be obtained.

The size of the transistors in the display device of this embodiment can be reduced, which facilitates an increase in the resolution and the application to an electronic device having a relatively small display unit.

This embodiment can be combined with the other embodiments as appropriate. In this specification, in the case where a plurality of structure examples are shown in one embodiment, the structure examples can be combined as appropriate.

Embodiment 2

In this embodiment, a pixel of a display device of one embodiment of the present invention will be described with reference to FIG. 7.

[Pixel]

A display device of this embodiment includes a plurality of pixels arranged in a matrix of m rows and n columns (m and n are each an integer of 1 or more). FIG. 7 illustrates an example of a circuit diagram of a pixel $200(i,j)$ (i is an integer of 1 or more and m or less, and j is an integer of 1 or more and n or less).

Figure 7:
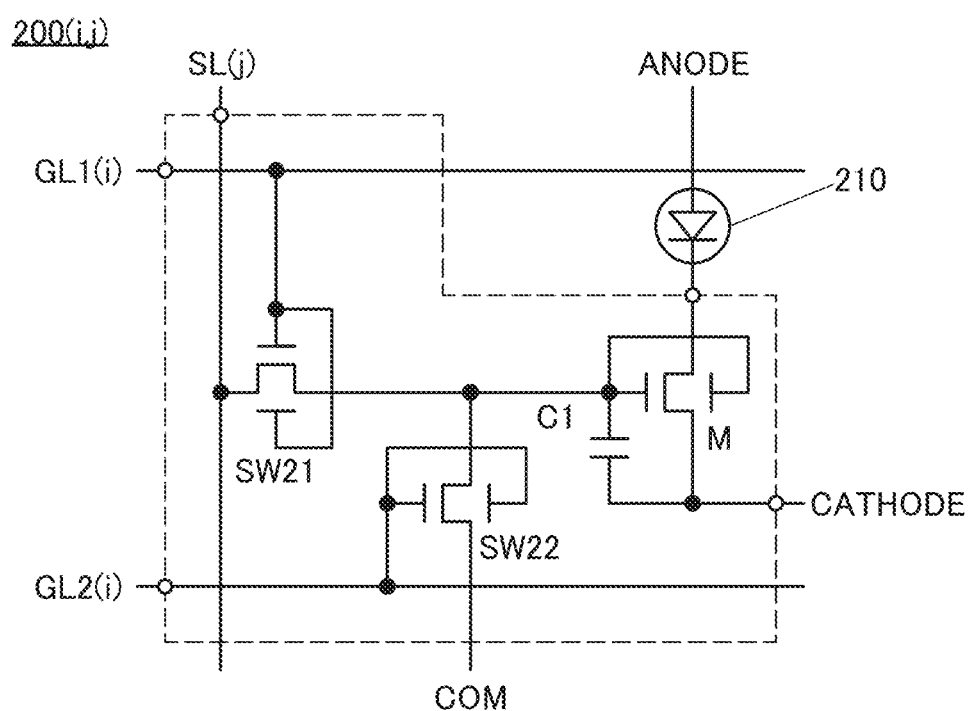
FIG. 7 is a circuit diagram illustrating an example of a pixel of a display device.

The pixel $200(i,j)$ illustrated in FIG. 7 includes a light-emitting element 210, a switch SW21, a switch SW22, a transistor M, and a capacitor C1.

In this embodiment, a transistor is used as the switch SW21. A gate of the switch SW21 is electrically connected to a scan line $GL1(i)$. One of a source and a drain of the switch SW21 is electrically connected to a signal line $SL(j)$ and the other is electrically connected to a gate of the transistor M.

In this embodiment, a transistor is used as the switch SW22. A gate of the switch SW22 is electrically connected to a scan line $GL2(i)$. One of a source and a drain of the switch SW22 is electrically connected to a wiring COM and the other is electrically connected to the gate of the transistor M.

The gate of the transistor M is electrically connected to one electrode of the capacitor C1, the other of the source and the drain of the switch SW21, and the other of the source and the drain of the switch SW22. One of a source and a drain of the transistor M is electrically connected to a wiring CATHODE and the other is electrically connected to a cathode of the light-emitting element 210.

The other electrode of the capacitor C1 is electrically connected to the wiring CATHODE.

An anode of the light-emitting element 210 is electrically connected to a wiring ANODE.

The scan line $GL1(i)$ has a function of supplying a selection signal. The scan line $GL2(i)$ has a function of supplying a control signal. The signal line $SL(j)$ has a function of supplying an image signal. A constant potential is supplied to each of a wiring VCOM, the wiring CATHODE, and the wiring ANODE. In the light-emitting element 210, the anode side can have a high potential and the cathode side can have a lower potential than the anode side.

The switch SW21 is controlled by a selection signal and functions as a selection transistor for controlling the selection state of the pixel 200.

The transistor M functions as a driving transistor that controls a current flowing through the light-emitting element 210 in accordance with a potential supplied to the gate. When the switch SW21 is in a conduction state, an image signal supplied to the signal line $SL(j)$ is supplied to the gate of the transistor M, and the luminance of the light-emitting element 210 can be controlled in accordance with the potential.

The switch SW22 has a function of controlling the gate potential of the transistor M on the basis of a control signal. Specifically, the switch SW22 can supply a potential for bringing the transistor M into a non-conduction state to the gate of the transistor M.

The switch SW22 can be used to control a pulse width, for example. During a period based on a control signal, a current can be supplied from the transistor M to the light-emitting element 210. Alternatively, the light-emitting element 210 can express gray levels on the basis of the image signal and the control signal.

Here, as each of the transistors included in the pixel 200(i,j), it is preferable to use a transistor including a metal oxide (an oxide semiconductor) for a semiconductor layer where a channel is formed.

A transistor including a metal oxide having a wider band gap and a lower carrier density than silicon can achieve an extremely low off-state current. Thus, such a low off-state current enables retention of charge accumulated in a capacitor that is connected in series with the transistor for a long time. Thus, in particular, transistors including an oxide semiconductor are preferably used as the switch SW21 and the switch SW22 series-connected to the capacitor C1. Moreover, the use of transistors using an oxide semiconductor as the other transistors can reduce the manufacturing cost.

Alternatively, a transistor including silicon as a semiconductor in which a channel is formed can be used as the transistor included in the pixel 200(i,j). In particular, the use of silicon with high crystallinity, such as single crystal silicon or polycrystalline silicon, is preferable because high field-effect mobility can be achieved and higher-speed operation is possible.

Alternatively, a transistor using an oxide semiconductor may be used as one or more of the transistors included in the pixel 200(i,j), and transistors using silicon may be used as the other transistors.

Although n-channel transistors are shown as the transistors in FIG. 7, p-channel transistors can be used as appropriate.

[Transistor]

Next, a transistor that can be used for the display device will be described.

There is no particular limitation on the structure of the transistor in the display device. For example, a planar transistor may be employed, a staggered transistor may be employed, or an inverted staggered transistor may be employed. A top-gate transistor or a bottom-gate transistor may be used. Alternatively, gate electrodes may be provided above and below a channel.

As the transistor of the display device, a transistor including a metal oxide in a channel formation region can be used, for example. Therefore, a transistor with an extremely low off-state current can be obtained.

Alternatively, as the transistor of the display device, a transistor including silicon in a channel formation region may be used. Examples of the transistor include a transistor containing amorphous silicon, a transistor containing crystalline silicon (typically, low-temperature polysilicon), and a transistor containing single crystal silicon.

[Metal Oxide]

A metal oxide that can be used for the semiconductor layer will be described below.

The metal oxide preferably contains at least indium or zinc. In particular, indium and zinc are preferably contained. Furthermore, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In—M—Zn oxide that contains indium, an element M, and zinc is considered. Note that the element M is aluminum, gallium, yttrium, tin, or the like. Other examples that can be used as the element M include boron, titanium, iron, nickel, germanium, zirconium, molybdenum, lanthanum, cerium, neodymium, hafnium, tantalum, tungsten, and magnesium. Note that it is sometimes acceptable to use a plurality of the above-described elements in combination as the element M.

The metal oxide film can be formed by a sputtering method. Alternatively, a PLD method, a PECVD method, a thermal CVD method, an ALD method, a vacuum evaporation method, or the like may be used.

Note that in this specification and the like, a metal oxide containing nitrogen is also collectively referred to as a metal oxide in some cases. A metal oxide containing nitrogen may be referred to as a metal oxynitride. For example, a metal oxide containing nitrogen, such as zinc oxynitride (ZnON), may be used for the semiconductor layer.

Note that in this specification and the like, CAAC (c-axis aligned crystal) and CAC (Cloud-Aligned Composite) might be stated. Note that CAAC refers to an example of a crystal structure, and CAC refers to an example of a function or a material composition.

For example, a CAC (Cloud-Aligned Composite)-OS can be used for the semiconductor layer.

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used for a semiconductor layer of a transistor, the conducting function is to allow electrons (or holes) serving as carriers to flow, and the insulating function is to not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

Oxide semiconductors (metal oxides) can be classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as $V_O$)). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that indium-gallium-zinc oxide (hereinafter referred to as IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity as compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

A metal oxide film that functions as a semiconductor layer can be formed using either or both of an inert gas and an oxygen gas. Note that there is no particular limitation on the flow rate ratio of oxygen (the partial pressure of oxygen) at the time of forming the metal oxide film. However, to obtain a transistor having high field-effect mobility, the flow rate ratio of oxygen (the partial pressure of oxygen) at the time of forming the metal oxide film is preferably higher than or equal to 0% and lower than or equal to 30%, further preferably higher than or equal to 5% and lower than or equal to 30%, still further preferably higher than or equal to 7% and lower than or equal to 15%.

The energy gap of the metal oxide is preferably 2 eV or more, further preferably 2.5 eV or more, still further preferably 3 eV or more. With the use of a metal oxide having such a wide energy gap, the off-state current of the transistor can be reduced.

This embodiment can be combined with the other embodiments as appropriate.

Embodiment 3

In this embodiment, electronic devices of embodiments of the present invention will be described with reference to FIG. 8 to FIG. 12.

The electronic device of this embodiment includes the display device of one embodiment of the present invention in a display unit. The display device of one embodiment of the present invention has high display quality and low power consumption. In addition, the display device of one embodiment of the present invention can be easily increased in resolution and size. Thus, the display device of one embodiment of the present invention can be used for a display unit of a variety of electronic devices.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

In particular, the display device of one embodiment of the present invention can have high resolution, and thus can be suitably used for an electronic device having a relatively small display unit. Such an electronic device can be suitably used for, for example, a watch-type or bracelet-type information terminal device (wearable device) and a wearable device worn on a head, such as a device for VR (Virtual Reality) such as a head-mounted display, a glasses-type device for AR (Augmented Reality), or a device for MR (Mixed Reality).

The electronic device of this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device of this embodiment can have a variety of functions. For example, the electronic device of this embodiment can have a function of displaying a variety of data (a still image, a moving image, a text image, and the like) on the display unit, a touch panel function, a function of displaying a calendar, date, time, and the like, a function of executing a variety of software (programs), a wireless communication function, and a function of reading out a program or data stored in a recording medium.

Figure 8A:
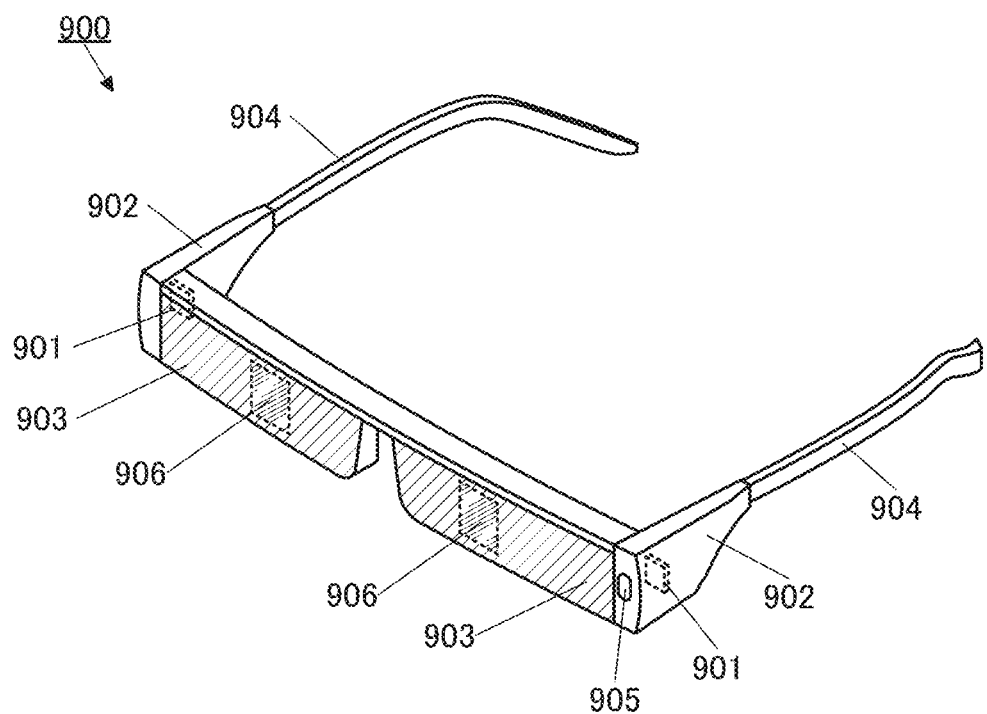
FIGS. 8A and 8B are diagrams illustrating an example of an electronic device.

FIG. 8(A) is a perspective view of a glasses-type electronic device 900. The electronic device 900 includes a pair of display panels 901, a pair of housings 902, a pair of optical members 903, a pair of mounting portions 904, and the like.

The electronic device 900 can project an image displayed on the display panel 901 onto a display region 906 of the optical member 903. Since the optical members 903 have a light-transmitting property, a user can see images displayed on the display regions 906, which are superimposed on transmission images seen through the optical members 903. Thus, the electronic device 900 is an electronic device capable of AR display.

The display panel 901 included in the electronic device 900 preferably has a function of taking an image in addition to a function of displaying an image. In that case, the electronic device 900 can receive light incident on the display panel 901 through the optical member 903, and convert the light into an electric signal to be output. Thus, an image of the user's eye or the eye and its vicinity can be taken and the image can be output to the outside or an arithmetic unit included in the electronic device 900 as image data.

One housing 902 is provided with a camera 905 capable of taking an image of what lies in front thereof. Although not illustrated, one of the housings 902 is provided with a wireless receiver or a connector to which a cable can be connected, whereby a video signal or the like can be supplied to the housing 902. Furthermore, when an acceleration sensor such as a gyroscope sensor is disposed in the housing 902, the orientation of the user's head can be detected and an image corresponding to the orientation can be displayed on the display region 906. Moreover, the housing 902 is preferably provided with a battery, and charging is preferably performed with or without a wire.

Figure 8B:
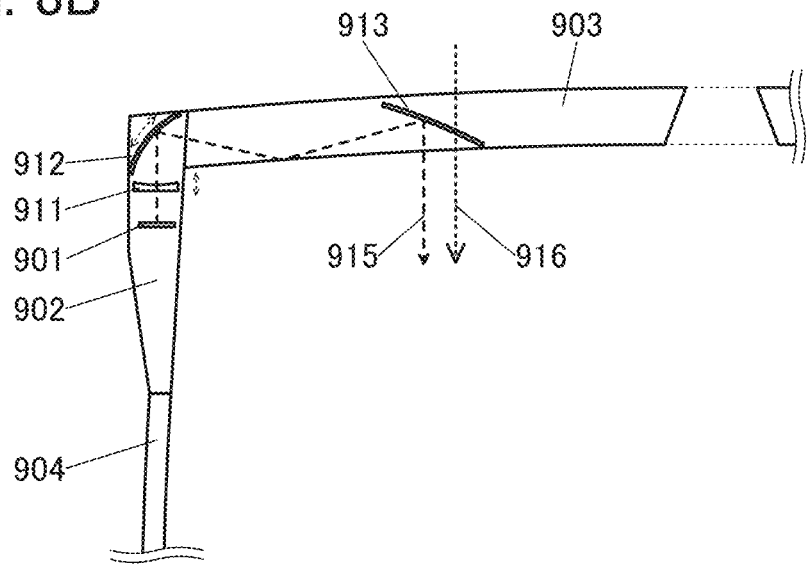

Next, a method for projecting an image on the display region 906 of the electronic device 900 is described with reference to FIG. 8(B). The display panel 901, a lens 911, and a reflective plate 912 are provided in the housing 902. A reflective surface 913 functioning as a half mirror is provided in a portion corresponding to the display region 906 of the optical member 903.

Light 915 emitted from the display panel 901 passes through the lens 911 and is reflected by the reflective plate 912 to the optical member 903 side. In the optical member 903, the light 915 is fully reflected repeatedly by end surfaces of the optical member 903 and reaches the reflective surface 913, whereby an image is projected on the reflective surface 913. Accordingly, the user can see both the light 915 reflected by the reflective surface 913 and transmitted light 916 that has passed through the optical member 903 (including the reflective surface 913).

FIG. 8 shows an example in which the reflective plate 912 and the reflective surface 913 each have a curved surface. This can increase optical design flexibility and reduce the thickness of the optical member 903, compared to the case where they have flat surfaces. Note that the reflective plate 912 and the reflective surface 913 may have flat surfaces.

The reflective plate 912 can use a component having a mirror surface, and preferably has high reflectivity. As the reflective surface 913, a half mirror utilizing reflection of a metal film may be used, but the use of a prism utilizing total reflection or the like can increase the transmittance of the transmitted light 916.

Here, the electronic device 900 preferably includes a mechanism for adjusting one or both of the distance and angle between the lens 911 and the display panel 901. This enables focus adjustment, zooming in/out of an image, or the like. One or both of the lens 911 and the display panel 901 are configured to be movable in the optical-axis direction, for example.

The electronic device 900 preferably includes a mechanism capable of adjusting the angle of the reflective plate 912. The position of the display region 906 where images are displayed can be changed by changing the angle of the reflective plate 912. Thus, the display region 906 can be placed at the optimal position in accordance with the position of the user's eye.

The display device of one embodiment of the present invention can be used for the display panel 901. Thus, the electronic device 900 can perform display with extremely high resolution.

Figure 9A:
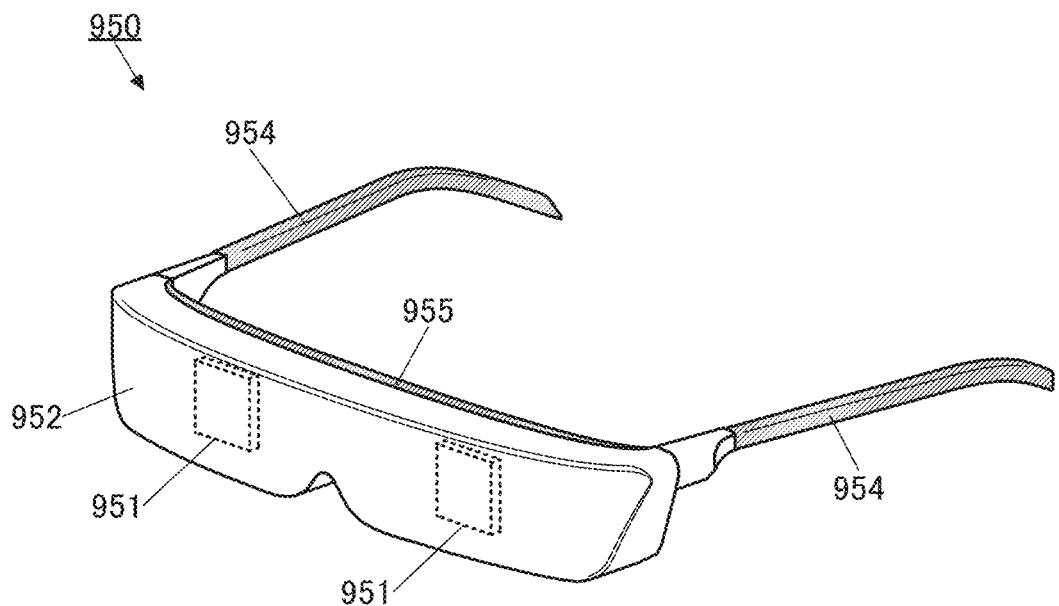
FIGS. 9A and 9B are diagrams illustrating an example of an electronic device.
Figure 9B:
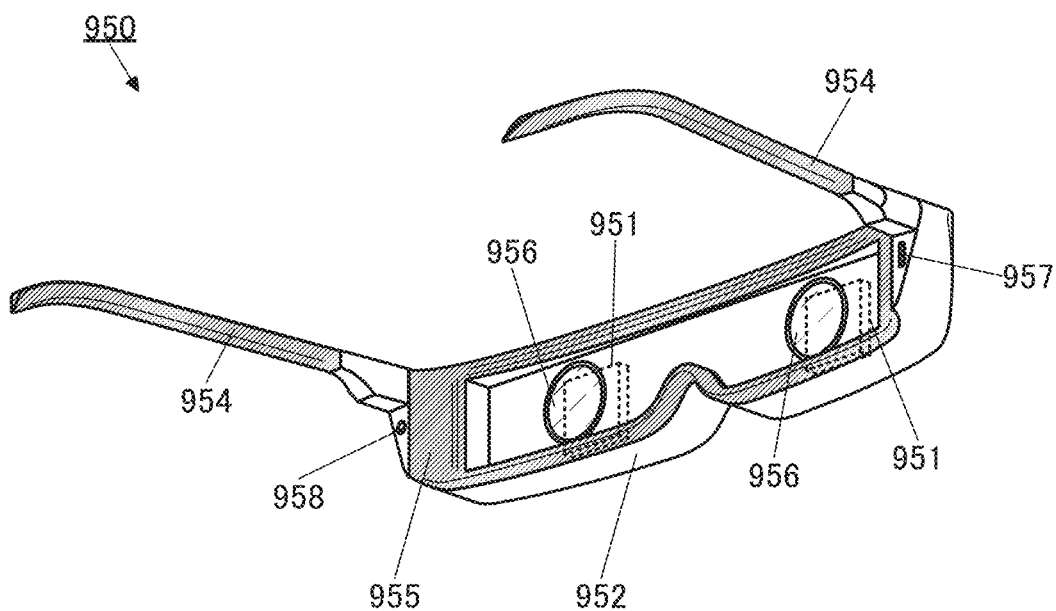

FIGS. 9(A) and 9(B) illustrate perspective views of a goggle-type electronic device 950. FIG. 9(A) is a perspective view illustrating the front surface, the top surface, and the left side surface of the electronic device 950, and FIG. 9(B) is a perspective view illustrating the back surface, the bottom surface, and the right side surface of the electronic device 950.

The electronic device 950 includes a pair of display panels 951, a housing 952, a pair of mounting portions 954, a cushion 955, a pair of lenses 956, and the like. The pair of display panels 951 is positioned to be seen through the lenses 956 inside the housing 952.

The electronic device 950 is an electronic device for VR. A user wearing the electronic device 950 can see an image displayed on the display panels 951 through the lenses 956.

Furthermore, when the pair of display panels 951 displays different images, three-dimensional display using parallax can be performed.

An input terminal 957 and an output terminal 958 are provided on the back surface side of the housing 952. To the input terminal 957, a cable for supplying a video signal from a video output device or the like, power for charging a battery provided in the housing 952, or the like can be connected. The output terminal 958 can function as, for example, an audio output terminal to which earphones, headphones, or the like can be connected. Note that in the case where audio data can be output by wireless communication or sound is output from an external video output device, the audio output terminal is not necessarily provided.

In addition, the electronic device 900 preferably includes a mechanism by which the left and right positions of the lenses 956 and the display panels 951 can be adjusted to the optimal positions in accordance with the positions of the user's eyes. In addition, a mechanism for adjusting focus by change in the distance between the lens 956 and the display panel 951 is preferably included.

The display device of one embodiment of the present invention can be used for the display panel 951. Thus, the electronic device 950 can perform display with extremely high resolution. This enables a user to feel high sense of immersion.

The cushion 955 is a portion in contact with the user's face (forehead, cheek, or the like). The cushion 955 is in close contact with the user's face, so that light leakage can be prevented, which further increases the sense of immersion. A soft material is preferably used for the cushion 955 so that the cushion 955 is in close contact with the user's face when the user wears the electronic device 950. For example, a material such as rubber, silicone rubber, urethane, or sponge can be used. Furthermore, when a sponge or the like whose surface is covered with cloth, leather (natural leather or synthetic leather), or the like is used as the cushion 955, a gap is unlikely to be generated between the user's face and the cushion 955, whereby light leakage can be suitably prevented. The member in contact with user's skin, such as the cushion 955 or the mounting portion 954, is preferably detachable, in which case cleaning or replacement can be easily performed.

Figure 10A:
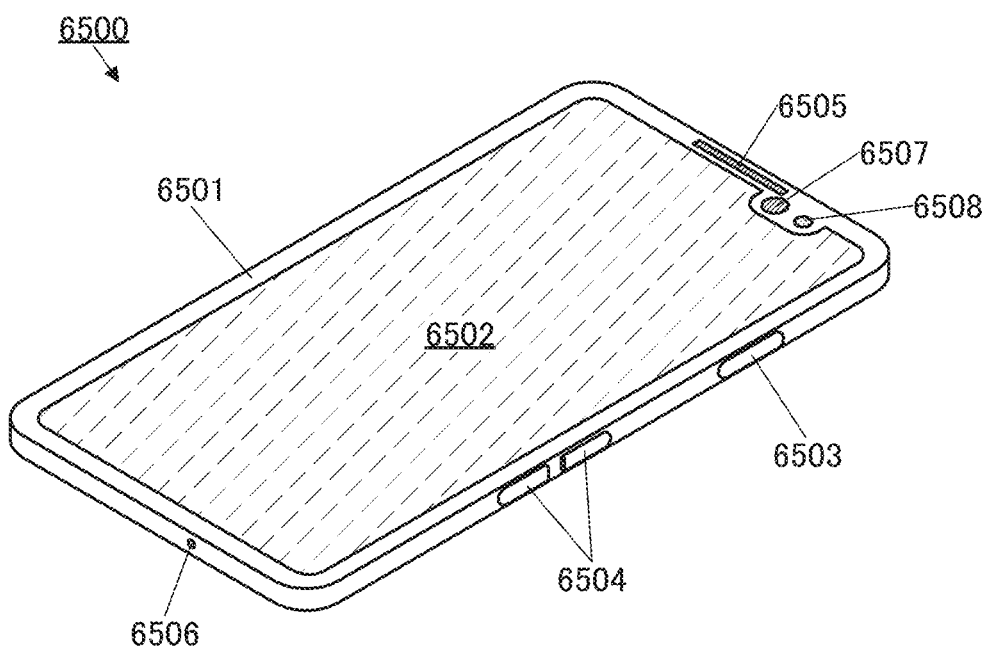
FIGS. 10A and 10B are diagrams illustrating an example of an electronic device.

An electronic device 6500 illustrated in FIG. 10(A) is a portable information terminal that can be used as a smartphone.

The electronic device 6500 includes a housing 6501, a display unit 6502, a power button 6503, buttons 6504, a speaker 6505, a microphone 6506, a camera 6507, a light source 6508, and the like. The display unit 6502 has a touch panel function.

The display device of one embodiment of the present invention can be used for the display unit 6502.

Figure 10B:
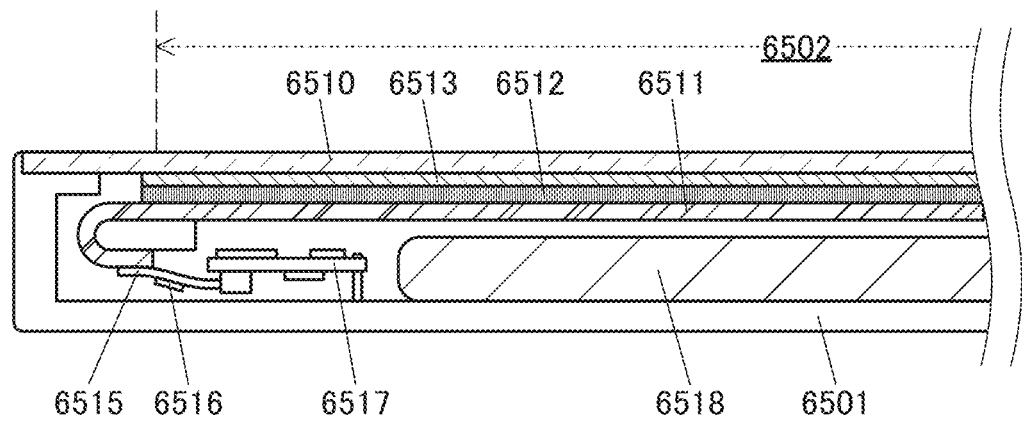

FIG. 10(B) is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not shown).

Part of the display panel 6511 is folded back in a region outside the display unit 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be provided. Since the display panel 6511 is extremely thin, the battery 6518 with high capacity can be mounted with the thickness of the electronic device controlled. An electronic device with a narrow frame can be obtained when part of the display panel 6511 is folded back so that the portion connected to the FPC 6515 is positioned on the rear side of a pixel portion.

Figure 11A:
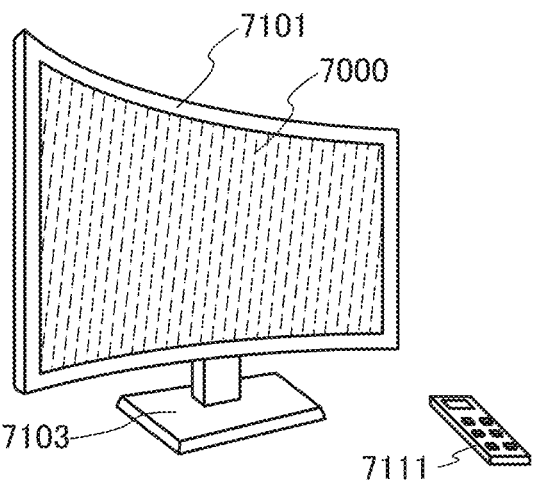
FIGS. 11A to 11D are diagrams illustrating examples of electronic devices.

FIG. 11(A) illustrates an example of a television device. In a television device 7100, a display unit 7000 is incorporated in a housing 7101. Here, a structure in which the housing 7101 is supported by a stand 7103 is illustrated.

The display device of one embodiment of the present invention can be used in the display unit 7000.

Operation of the television device 7100 illustrated in FIG. 11(A) can be performed with an operation switch provided in the housing 7101 or a separate remote controller 7111. Alternatively, the display unit 7000 may include a touch sensor, and the television device 7100 may be operated by touch on the display unit 7000 with a finger or the like. The remote controller 7111 may be provided with a display unit for displaying data output from the remote controller 7111. With operation keys or a touch panel provided in the remote controller 7111, channels and volume can be operated and videos displayed on the display unit 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 11B:
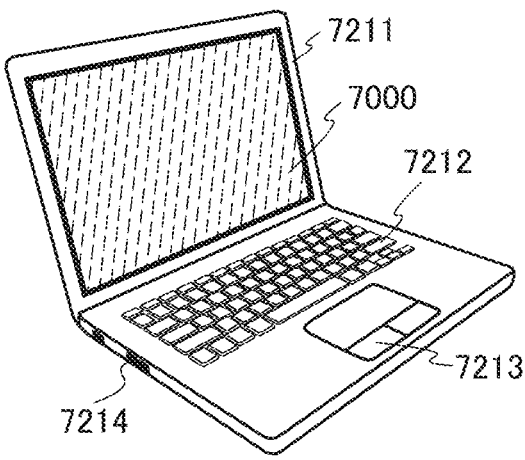

FIG. 11(B) illustrates an example of a laptop personal computer. A laptop personal computer 7200 includes a housing 7211, a keyboard 7212, a pointing device 7213, an external connection port 7214, and the like. In the housing 7211, the display unit 7000 is incorporated.

The display device of one embodiment of the present invention can be used in the display unit 7000.

Figure 11C:
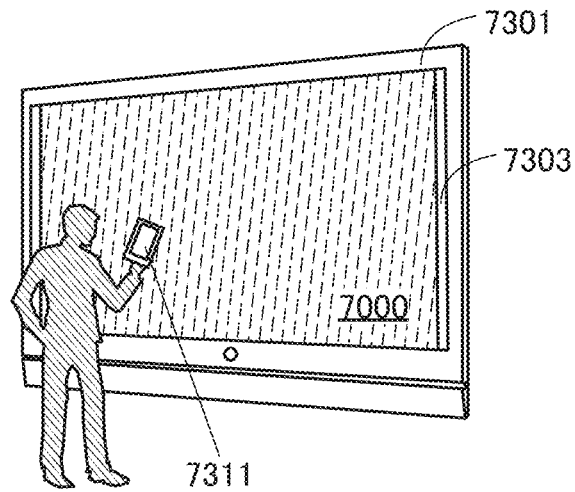
Figure 11D:
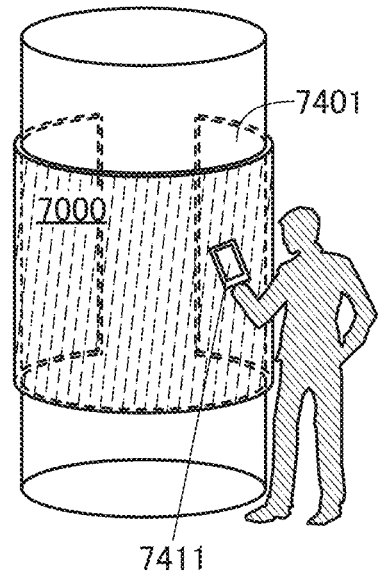

FIGS. 11(C) and 11(D) illustrate examples of digital signage.

Digital signage 7300 illustrated in FIG. 11(C) includes a housing 7301, the display unit 7000, a speaker 7303, and the like. Furthermore, the digital signage can include an LED lamp, operation keys (including a power switch or an operation switch), a connection terminal, a variety of sensors, a microphone, and the like.

FIG. 11(D) is digital signage 7400 attached to a cylindrical pillar 7401. The digital signage 7400 includes the display unit 7000 provided along a curved surface of the pillar 7401.

The display device of one embodiment of the present invention can be used for the display unit 7000 in FIGS. 11(C) and 11(D).

A larger area of the display unit 7000 can increase the amount of data that can be provided at a time. The larger display unit 7000 attracts more attention, so that the effectiveness of the advertisement can be increased, for example.

The use of a touch panel in the display unit 7000 is preferable because in addition to display of a still image or a moving image on the display unit 7000, intuitive operation by a user is possible. Moreover, for an application for providing information such as route information or traffic information, usability can be enhanced by intuitive operation.

Furthermore, as illustrated in FIGS. 11(C) and 11(D), it is preferable that the digital signage 7300 or the digital signage 7400 work with an information terminal 7311 or an information terminal 7411 such as a user's smartphone through wireless communication. For example, information of an advertisement displayed on the display unit 7000 can be displayed on a screen of the information terminal 7311 or the information terminal 7411. By operation of the information terminal 7311 or the information terminal 7411, display on the display unit 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Electronic devices shown in FIG. 12(A) to FIG. 12(F) include a housing 9000, a display unit 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 12(A) to FIG. 12(F) have a variety of functions. For example, the electronic devices can have a function of displaying a variety of data (a still image, a moving image, a text image, and the like) on the display unit, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display units. The electronic devices may each include a camera or the like and have a function of taking a still image or a moving image and storing the taken image in a recording medium (an external recording medium or a recording medium incorporated in the camera), a function of displaying the taken image on the display unit, or the like.

The details of the electronic devices shown in FIG. 12(A) to FIG. 12(F) will be described below.

Figure 12A:
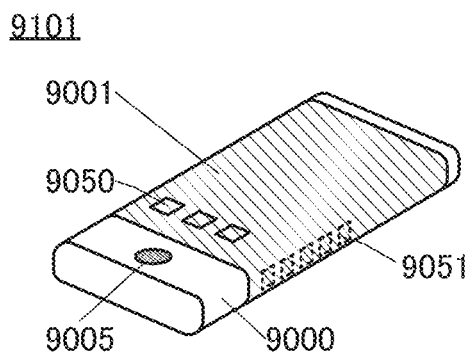
FIGS. 12A to 12F illustrating examples of electronic devices.

FIG. 12(A) is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 12(A) shows an example where three icons 9050 are displayed. Information 9051 indicated by dashed rectangles can be displayed on another surface of the display unit 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 12B:
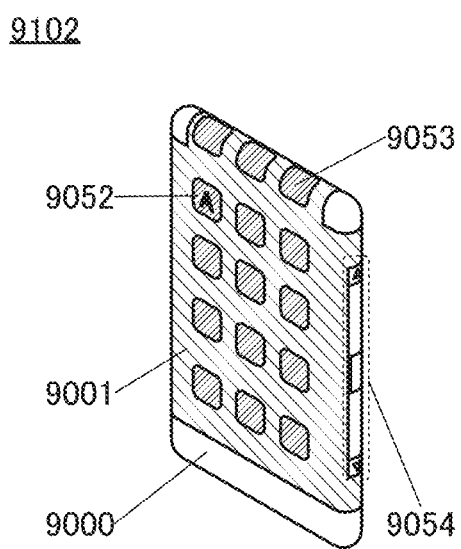

FIG. 12(B) is a perspective view illustrating a portable information terminal 9102. The portable information terminal 9102 has a function of displaying information on three or more surfaces of the display unit 9001. Here, an example in which information 9052, information 9053, and information 9054 are displayed on different surfaces is shown. For example, the user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 12C:
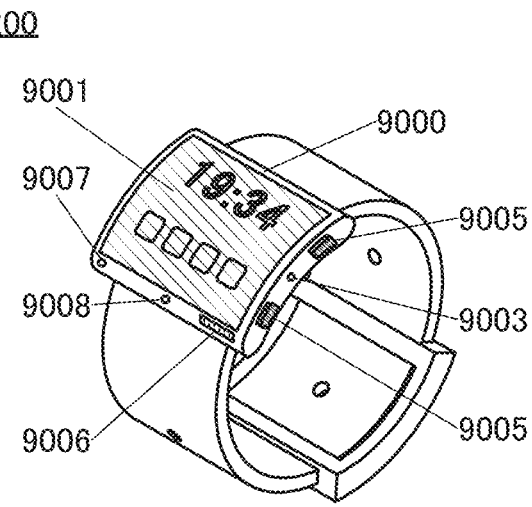

FIG. 12(C) is a perspective view illustrating a watch-type portable information terminal 9200. For example, the portable information terminal 9200 can be used as a smart watch. The display surface of the display unit 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 12D:
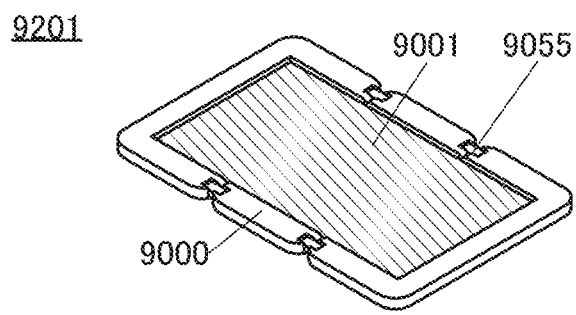
Figure 12E:
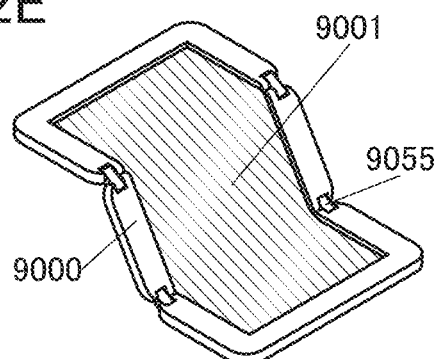
Figure 12F:
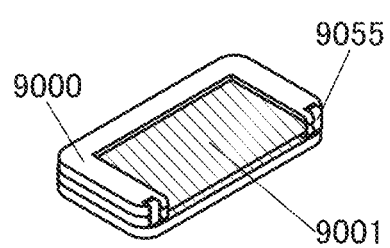

FIGS. 12D, 12E, and 12F are perspective views illustrating a foldable portable information terminal 9201. FIG. 12(D) is a perspective view of an opened state of the portable information terminal 9201, FIG. 12(F) is a perspective view of a folded state thereof, and FIG. 12(E) is a perspective view of a state in the middle of change from one of FIG. 12(D) and FIG. 12(F) to the other. The portable information terminal 9201 is highly portable in the folded state and is highly browsable in the opened state because of a seamless large display region. The display unit 9001 of the portable information terminal 9201 is supported by three housings 9000 joined by hinges 9055. For example, the display unit 9001 can be folded with a radius of curvature of greater than or equal to 0.1 mm and less than or equal to 150 mm.

This embodiment can be combined with the other embodiments and the example as appropriate.

EXAMPLE

In this example, a result of fabrication of the display device of one embodiment of the present invention will be described.

In this example, an active matrix display device in which the diagonal size of a display unit was 2.23 inches, the number of effective pixels was 20×20, and the pixel size was 2000 μm×2000 μm (mounting pitch of an LED package) was fabricated.

A 1-mm-square LED package including mini LED chips of three colors of red, green, and blue was used as a display element.

As the transistor, a self-aligned top gate (Top Gate Self-Alignment, TGSA) transistor in which a crystalline metal oxide was used for a semiconductor layer was used. As the metal oxide, an In—Ga—Zn-based oxide was used.

A gate driver and a source driver were not incorporated.

A pixel circuit of the display device of this example corresponds to the pixel circuit illustrated in FIG. 7.

The display device of this example has the top structure illustrated in FIGS. 1(A) to 1(C) and the cross-sectional structure illustrated in FIGS. 2(A) to 2(C) and FIGS. 3(A) to 3(C). Note that the insulating layer 104 and the resin 129 are not provided.

A glass substrate was used as the substrate 102. A stacked-layer structure of an approximately 100-nm-thick titanium film, an approximately 400-nm-thick aluminum film, and an approximately 100-nm-thick titanium film was used for the conductive layer 131R, the conductive layer 131G, the conductive layer 131B, and the conductive layer 132. That is, in each of the conductive layer 131R, the conductive layer 131G, the conductive layer 131B, and the conductive layer 132, a layer in contact with the conductor 133 is the titanium film. An approximately 2-μm-thick acrylic film was used as the protective layer 128.

After the stacked-layer structure from the transistor 120 to the protective layer 128 was formed over the substrate 102, a silver paste was applied as the conductor 133 over the conductive layer 131R, the conductive layer 131G, the conductive layer 131B, and the conductive layer 132, and the LED package 150 was mounted.

Figure 13:
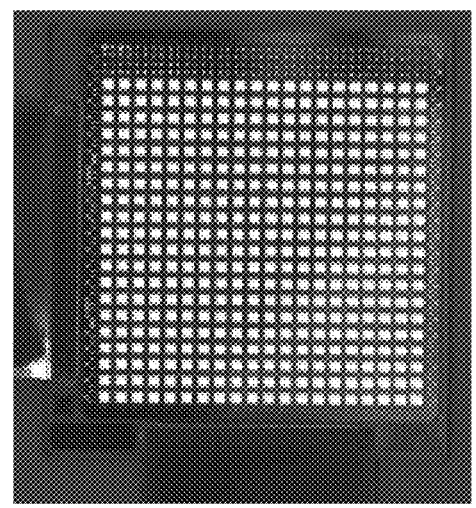
FIG. 13 is a display photograph of a display device in Example.

FIG. 13 is a display photograph of the display device of this example.

As described above, in this example, the LED package was mounted on the substrate provided with the transistors in which a metal oxide was used for the semiconductor layers, so that the active matrix display device was fabricated. Furthermore, as shown in FIG. 13, a favorable display result was able to be obtained in the display device fabricated in this example.

REFERENCE NUMERALS

C1: capacitor, GL1: scan line, GL2: scan line, SW21: switch, SW22: switch, 100: display device, 100A: display device, 101: substrate, 102: substrate, 103: electrode, 104: insulating layer, 106: electrode, 108: wiring, 109: circuit, 110: display unit, 111: semiconductor layer, 112: electrode, 113: light-emitting layer, 114: semiconductor layer, 115: electrode, 116: electrode, 117: semiconductor layer, 118: light-emitting layer, 119: semiconductor layer, 120: transistor, 120A: transistor, 120B: transistor, 120C: transistor, 121: conductive layer, 122: insulating layer, 123: metal oxide layer, 123*i*: channel formation region, 123*n*: low-resistance region, 124: insulating layer, 124*a*: insulating layer, 124*b*: insulating layer, 125: conductive layer, 126*a*: conductive layer, 126*b*: conductive layer, 127: insulating layer, 128: protective layer, 129: resin, 130: pixel, 131B: conductive layer, 131G: conductive layer, 131R: conductive layer, 132: conductive layer, 133: conductor, 141: substrate, 142: case, 143: wire, 144: wire, 145: sealing layer, 146: adhesive layer, 147: color conversion layer, 150: LED package, 151: substrate, 151B: blue LED chip, 151G: green LED chip, 151R: red LED chip, 152B: electrode, 152G: electrode, 152R: electrode, 153: electrode, 154: heat sink, 155: LED package, 161: conductive layer, 162: insulating layer, 163: insulating layer, 164: insulating layer, 165: metal oxide layer, 166: conductive layer, 167: insulating layer, 168: conductive layer, 171: insulating layer, 172: conductive layer, 173: insulating layer, 174: substrate, 175: insulating layer, 181: insulating layer, 182: insulating layer, 183: insulating layer, 184*a*: conductive layer, 184*b*: conductive layer, 185: insulating layer, 186: insulating layer, 187: conductive layer, 188: insulating layer, 189: conductive layer, 190: transistor, 191: substrate, 192: element isolation layer, 193: low-resistance region, 194: insulating layer, 195: conductive layer, 196: insulating layer, 198: conductive layer, 199: insulating layer, 200: pixel, 210: light-emitting element, 900: electronic device, 901: display panel, 902: housing, 903: optical member, 904: mounting portion, 905: camera, 906: display region, 911: lens, 912: reflective plate, 913: reflective surface, 915: light, 916: transmitted light, 950: electronic device, 951: display panel, 952: housing, 954: mounting portion, 955: cushion, 956: lens, 957: input terminal, 958: output terminal, 6500: electronic device, 6501: housing, 6502: display unit, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display unit, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display unit, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A display device comprising:
a pixel comprising a first transistor, a second transistor, a first conductive layer and a light-emitting diode package,
wherein the light-emitting diode package comprises a first light-emitting diode, a second light-emitting diode, a second conductive layer, a third conductive layer and a fourth conductive layer,
wherein the first light-emitting diode comprises a first electrode and a second electrode,
wherein the second light-emitting diode comprises a third electrode and a fourth electrode,
wherein one of a source and a drain of the first transistor is electrically connected to the first electrode through the second conductive layer,
wherein one of a source and a drain of the second transistor is electrically connected to the third electrode through the third conductive layer,
wherein the first conductive layer is electrically connected to the second electrode through the fourth conductive layer,
wherein the first conductive layer is electrically connected to the fourth electrode through the fourth conductive layer,
wherein a constant potential is supplied to the first conductive layer,
wherein the fourth conductive layer is electrically connected to the second electrode through a first wire,
wherein the fourth conductive layer is electrically connected to the fourth electrode through a second wire, and
wherein the third conductive layer is electrically connected to the third electrode through a third wire.

2. The display device according to claim 1, wherein each of the first light-emitting diode and the second light-emitting diode is a mini light-emitting diode.

3. The display device according to claim 1, wherein each of the first light-emitting diode and the second light-emitting diode is a micro light-emitting diode.

4. The display device according to claim 1, wherein an emission of the first light-emitting diode has a different color from an emission of the second light-emitting diode.

5. The display device according to claim 1, wherein each of the first transistor and the second transistor comprises a metal oxide in a channel formation region.

6. The display device according to claim 1,
wherein the second conductive layer and the first electrode are in contact with each other.

7. A display module comprising:
the display device according to claim 1; and
one of a connector and an integrated circuit.

8. An electronic device comprising:
the display module according to claim 7; and
at least one of an antenna, a battery, a housing, a camera, a speaker, a microphone and an operation button.

9. A display device comprising:
a pixel comprising a first transistor, a second transistor, a third transistor, a first conductive layer and a light-emitting diode package,
wherein the light-emitting diode package comprises a first light-emitting diode, a second light-emitting diode, a third light-emitting diode, a second conductive layer, a third conductive layer, a fourth conductive layer and a fifth conductive layer,
wherein the first light-emitting diode comprises a first electrode and a second electrode,
wherein the second light-emitting diode comprises a third electrode and a fourth electrode,
wherein the third light-emitting diode comprises a fifth electrode and a sixth electrode,
wherein one of a source and a drain of the first transistor is electrically connected to the first electrode through the second conductive layer,
wherein one of a source and a drain of the second transistor is electrically connected to the third electrode through the third conductive layer,
wherein one of a source and a drain of the third transistor is electrically connected to the fifth electrode through the fifth conductive layer,
wherein the first conductive layer is electrically connected to the second electrode through the fourth conductive layer,
wherein the first conductive layer is electrically connected to the fourth electrode through the fourth conductive layer,
wherein the first conductive layer is electrically connected to the sixth electrode through the fourth conductive layer,
wherein a constant potential is supplied to the first conductive layer,
wherein the fourth conductive layer is electrically connected to the second electrode through a first wire,
wherein the fourth conductive layer is electrically connected to the fourth electrode through a second wire, and
wherein the third conductive layer is electrically connected to the third electrode through a third wire.

10. The display device according to claim 9, wherein each of the first light-emitting diode, the second light-emitting diode and the third light-emitting diode is a mini light-emitting diode.

11. The display device according to claim 9, wherein each of the first light-emitting diode, the second light-emitting diode and the third light-emitting diode is a micro light-emitting diode.

12. The display device according to claim 9,
wherein the first light-emitting diode is configured to emit red light,
wherein the second light-emitting diode is configured to emit green light, and
wherein the third light-emitting diode is configured to emit blue light.

13. The display device according to claim 9, wherein each of the first transistor, the second transistor, and the third transistor comprises a metal oxide in a channel formation region.

14. The display device according to claim 9, wherein the second conductive layer and the first electrode are in contact with each other.

15. A display module comprising:
the display device according to claim 9; and
one of a connector and an integrated circuit.

16. An electronic device comprising:
the display module according to claim 15; and
at least one of an antenna, a battery, a housing, a camera, a speaker, a microphone and an operation button.

* * * * *